United States Patent
Nakano et al.

(10) Patent No.: US 9,428,413 B2
(45) Date of Patent: Aug. 30, 2016

(54) LASER WORKING METHOD, LASER WORKING APPARATUS, AND ITS MANUFACTURING METHOD

(75) Inventors: Makoto Nakano, Hamamatsu (JP); Koji Kuno, Hamamatsu (JP); Tetsuya Osajima, Hamamatsu (JP); Takashi Inoue, Hamamatsu (JP); Masayoshi Kumagai, Tokyo (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 950 days.

(21) Appl. No.: 13/362,781

(22) Filed: Jan. 31, 2012

(65) Prior Publication Data
US 2012/0196427 A1    Aug. 2, 2012

Related U.S. Application Data

(63) Continuation of application No. 12/671,820, filed as application No. PCT/JP2008/063531 on Jul. 28, 2008, now Pat. No. 8,134,099.

(30) Foreign Application Priority Data

Aug. 3, 2007 (JP) .............................. P2007-203529

(51) Int. Cl.
*B23K 26/402* (2014.01)
*C03B 33/02* (2006.01)
(Continued)

(52) U.S. Cl.
CPC ....... *C03B 33/0222* (2013.01); *B23K 26/0057* (2013.01); *B23K 26/046* (2013.01);
(Continued)

(58) Field of Classification Search
CPC ............ B23K 26/0057; B23K 26/046; B23K 26/0635; B23K 26/0639; B23K 26/0861; B23K 26/128; B23K 26/4075; B23K 26/043; B23K 26/402; B28D 1/221; B28D 1/225; C03B 33/0222; G02B 5/136
See application file for complete search history.

(56) References Cited

U.S. PATENT DOCUMENTS

| | | |
|---|---|---|
| 5,248,877 A | 9/1993 | Cooper et al. |
| 6,075,656 A | 6/2000 | Bietry et al. |

(Continued)

FOREIGN PATENT DOCUMENTS

| | | |
|---|---|---|
| CN | 87106576 | 5/1988 |
| CN | 1161461 A | 10/1997 |

(Continued)

OTHER PUBLICATIONS

Machine translation of Japan Patent document No. 2005-103,630-A, Oct. 2014.*

(Continued)

*Primary Examiner* — Geoffrey S Evans
(74) *Attorney, Agent, or Firm* — Drinker Biddle & Reath LLP

(57) ABSTRACT

An object is irradiated with a laser light modulated by a reflection type spatial light modulator such that aberration of the laser light converged inside the object becomes a predetermined aberration or less. Therefore, aberration of the laser light generated at a position on which a converging point of the laser light is located is made as small as possible, to enhance the energy density of the laser light at that position, which makes it possible to form a modified region with a high function as a starting point for cutting. In addition, because the reflection type spatial light modulator is used, it is possible to improve the utilization efficiency of the laser light as compared with a transmissive type spatial light modulator.

17 Claims, 29 Drawing Sheets

(51) Int. Cl.
*B23K 26/00* (2014.01)
*B23K 26/04* (2014.01)
*B23K 26/08* (2014.01)
*B23K 26/12* (2014.01)
*B28D 1/22* (2006.01)
*B28D 5/00* (2006.01)
*B23K 26/40* (2014.01)

(52) U.S. Cl.
CPC ............ *B23K26/064* (2015.10); *B23K 26/066* (2015.10); *B23K 26/0624* (2015.10); *B23K 26/0861* (2013.01); *B23K 26/128* (2013.01); *B23K 26/40* (2013.01); *B28D 1/221* (2013.01); *B28D 5/00* (2013.01); *B23K 26/402* (2013.01); *B23K 2203/50* (2015.10); *Y10T 29/49826* (2015.01)

(56) References Cited

U.S. PATENT DOCUMENTS

| | | | |
|---|---|---|---|
| 6,624,880 | B2 | 9/2003 | Sandström et al. |
| 6,625,181 | B1 * | 9/2003 | Oshemkov et al. ...... 219/121.68 |
| 6,717,104 | B2 * | 4/2004 | Thompson et al. ...... 219/121.73 |
| 6,992,026 | B2 | 1/2006 | Fukuyo et al. |
| 7,209,279 | B2 | 4/2007 | Igasaki et al. |
| 7,333,255 | B2 | 2/2008 | Eda et al. |
| 8,134,099 | B2 * | 3/2012 | Nakano et al. ............ 219/121.69 |
| 8,828,891 | B2 * | 9/2014 | Sakamoto ..................... 438/463 |
| 2002/0105629 | A1 | 8/2002 | Sandstrom et al. |
| 2003/0010889 | A1 * | 1/2003 | Igasaki et al. ............. 250/201.9 |
| 2004/0002199 | A1 * | 1/2004 | Fukuyo et al. ................ 438/460 |
| 2005/0009301 | A1 | 1/2005 | Nagai et al. |
| 2005/0018259 | A1 * | 1/2005 | Holmes .............................. 359/3 |
| 2005/0098548 | A1 | 5/2005 | Kobayashi et al. |
| 2005/0199592 | A1 | 9/2005 | Iri et al. |
| 2005/0202596 | A1 * | 9/2005 | Fukuyo et al. ................ 438/113 |
| 2006/0108338 | A1 | 5/2006 | Nishiwaki et al. |
| 2006/0119743 | A1 * | 6/2006 | Lin ................................ 348/754 |
| 2006/0237405 | A1 | 10/2006 | Hunt et al. |
| 2006/0245084 | A1 * | 11/2006 | Brustle et al. ................. 359/744 |
| 2007/0051706 | A1 * | 3/2007 | Bovatsek et al. ........ 219/121.69 |
| 2007/0298529 | A1 | 12/2007 | Maeda et al. |
| 2008/0210673 | A1 * | 9/2008 | Audouard et al. ....... 219/121.81 |
| 2009/0117712 | A1 | 5/2009 | Sakamoto et al. |
| 2009/0212030 | A1 | 8/2009 | Clifford, Jr. |
| 2010/0232007 | A1 * | 9/2010 | Byren et al. ................. 359/291 |

FOREIGN PATENT DOCUMENTS

| | | | |
|---|---|---|---|
| CN | 1657220 | A | 8/2005 |
| CN | 1683106 | A | 10/2005 |
| CN | 1730225 | | 2/2006 |
| CN | 1802587 | A | 7/2006 |
| CN | 1966197 | A * | 5/2007 |
| CN | 1967815 | A * | 5/2007 |
| CN | 1993201 | A * | 7/2007 |
| EP | 1777031 | A1 * | 4/2007 |
| JP | 9-19784 | | 1/1997 |
| JP | 2001-228449 | | 8/2001 |
| JP | 2002049002 | A | 2/2002 |
| JP | 2002182174 | A | 6/2002 |
| JP | 2002-207202 | | 7/2002 |
| JP | 2002-210730 | A * | 7/2002 |
| JP | 2002273583 | A | 9/2002 |
| JP | 2003025085 | A | 1/2003 |
| JP | 2005-103630 | A * | 4/2005 |
| JP | 2005189434 | A | 7/2005 |
| JP | 2005-211909 | | 8/2005 |
| JP | 2005-224841 | | 8/2005 |
| JP | 2005266585 | A | 9/2005 |
| JP | 2005-292662 | | 10/2005 |
| JP | 2006-68762 | | 3/2006 |
| JP | 2006-113185 | | 4/2006 |
| JP | 2006-119427 | | 5/2006 |
| JP | 2006-131443 | A * | 5/2006 |
| JP | 2007021558 | A | 2/2007 |
| JP | 2007029959 | A | 2/2007 |
| JP | 2007-050410 | | 3/2007 |
| JP | 2007125582 | A | 5/2007 |
| JP | 2007-141995 | | 6/2007 |
| KR | 2007-0005707 | A | 1/2007 |
| TW | 200539980 | A | 12/2005 |
| TW | I250060 | B | 3/2006 |
| TW | I271251 | B | 1/2007 |
| TW | I394627 | B | 5/2013 |
| WO | 2005/106564 | | 11/2005 |
| WO | WO-2007/023940 | A1 | 3/2007 |

OTHER PUBLICATIONS

Machine translation of Japan Patent document No. 2006-131,443-A, Oct. 2014.*

T. Sano et al., "Evaluation of Processing Characteristics of Silicon with Picosecond Pulse Laser," Preprints of the National Meeting of Japan Welding Society, Apr. 2000, pp. 72-73, vol. 66 [English translation].

D. Du et al., "Laser Induced Breakdown by Impact Ionization in $SiO_2$ with Pulse Widths from 7ns to 150fs," Appl. Phys. Lett., Jun. 6, 1994, pp. 3071-3073, vol. 64, No. 23.

Kiyotaka Miura et al., "Formation of Photo-induced Structures in Glasses with Femtosecond Laser," Proceedings of 42nd Laser Materials Processing Conference, Nov. 1997, pp. 105-111, [English language abstract].

Ken-ichi Hayashi, "Inner Glass Marking by Harmonics of Solid-State Laser," Proceedings of 45th Laser Materials Processing Conference, Dec. 1998, pp. 23-28 [English language abstract].

Office Action from a related (not counterpart) Japanese patent application No. P2009-213545 dated Oct. 4, 2011 (in Japanese language only); 2 pages.

Office Action from a counterpart Taiwan patent application No. 097129384 dated Jun. 7, 2012 (in Chinese language only) 4 pages.

* cited by examiner

Fig.17
(a)
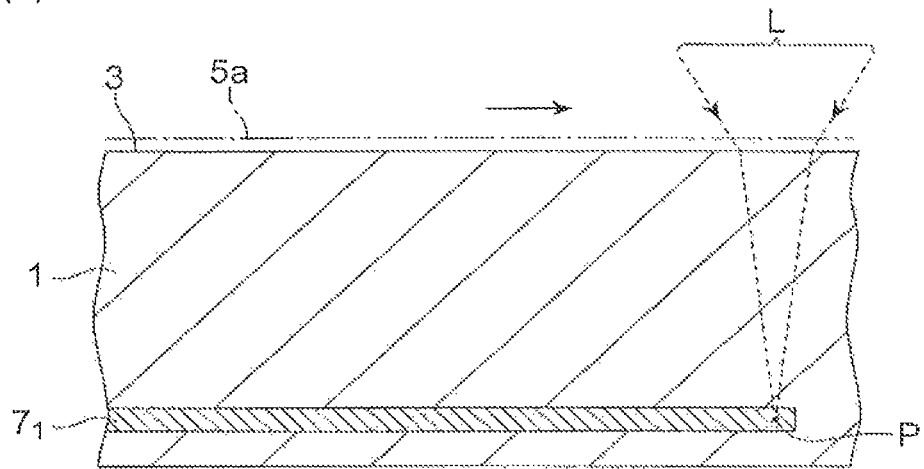
(b)
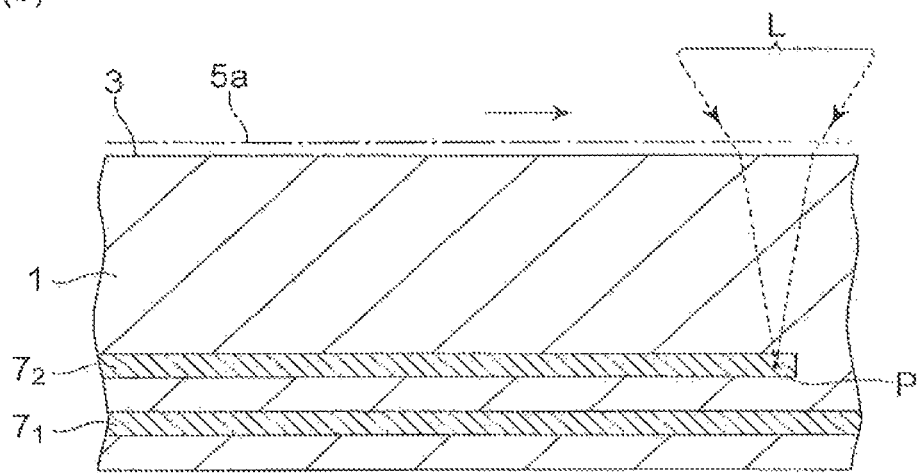

Fig.18
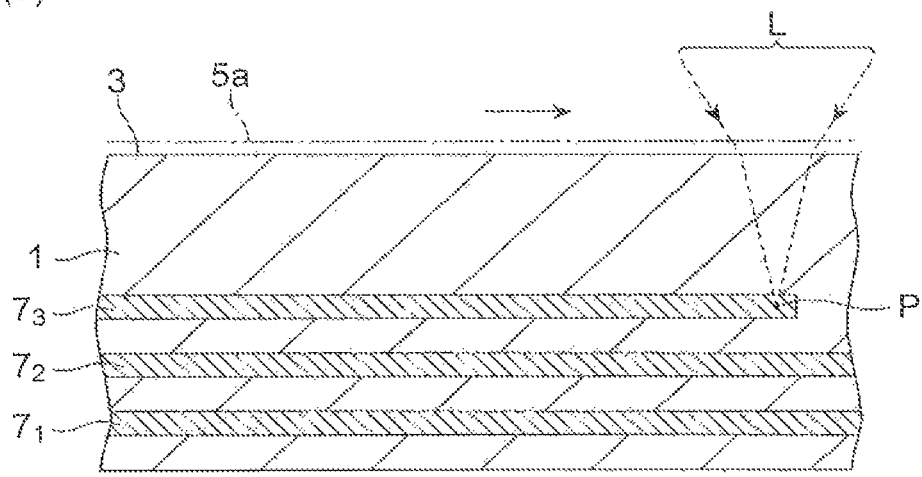
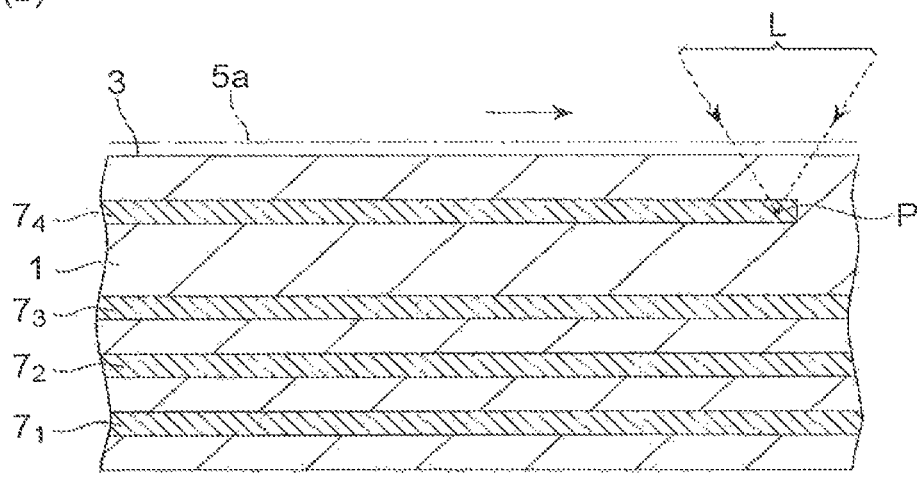

Fig.20 (a)
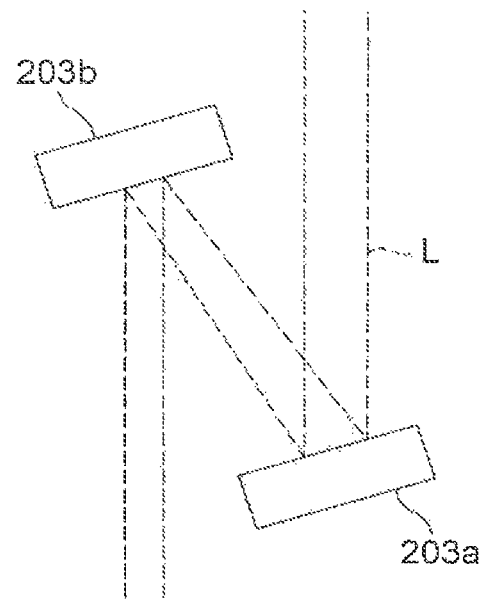
(b)
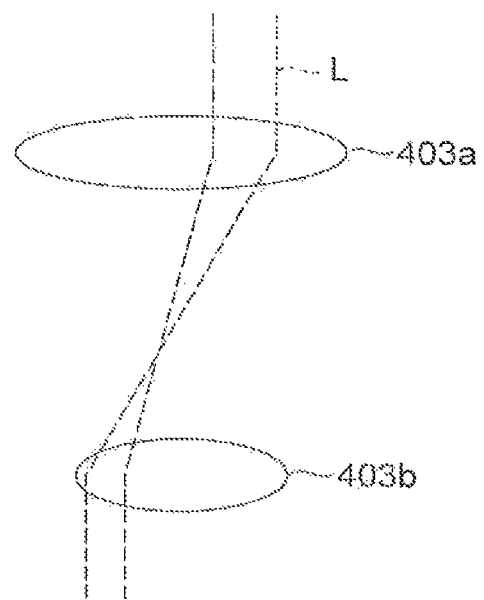

Fig.21
(a)
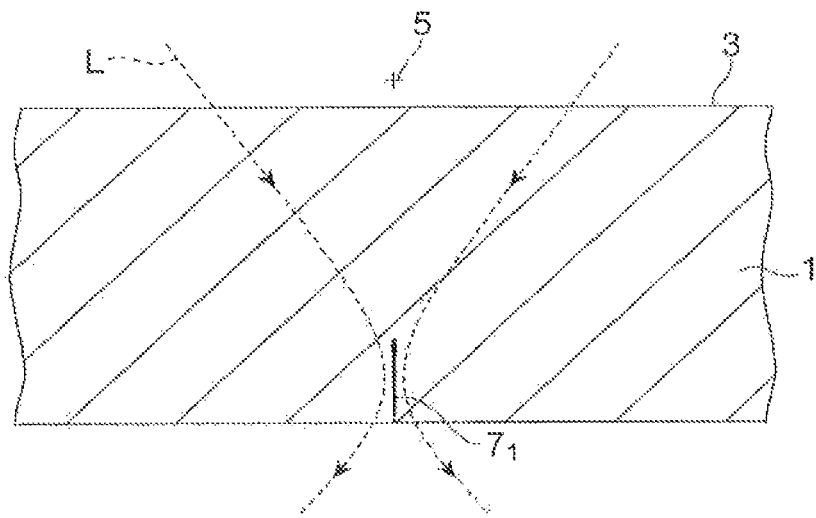
(b)
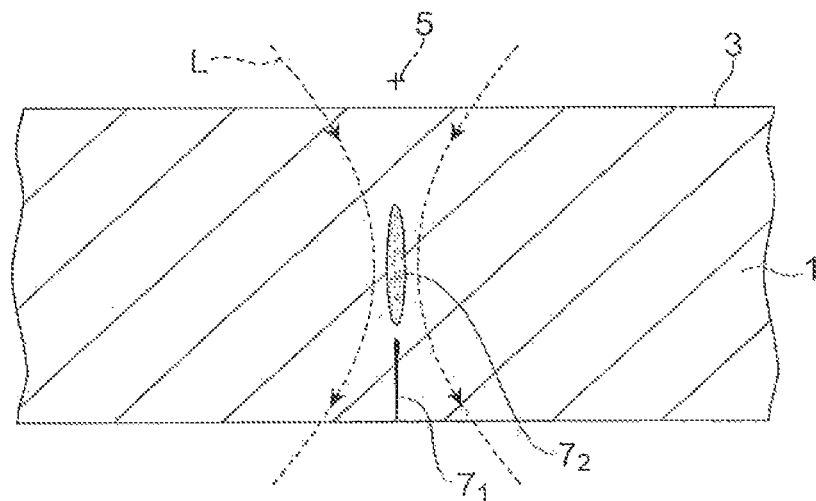

LASER WORKING METHOD, LASER WORKING APPARATUS, AND ITS MANUFACTURING METHOD

CROSS REFERENCE TO RELATED APPLICATIONS

This is a continuation application of application Ser. No. 12/671,820, now U.S. Pat. No. 8,134,099, filed on Mar. 25, 2010, which is a National Stage of International Application No. PCT/JP2008/063531, filed on Jul. 28, 2008, which claims the benefit of Japanese Patent Application No, P2007-203529, filed on Aug. 3, 2007, each of which is incorporated by reference herein in its entirety.

TECHNICAL FIELD

The present invention relates to a laser working method for cutting a plate-shaped object to be processed along a line to cut, a laser working apparatus and its manufacturing method.

BACKGROUND ART

As a conventional laser working apparatus, in Patent Document 1, there is described a laser working apparatus that diffuses a laser light emitted from a laser light source by a laser diffusing point moving means, and converges the diffused laser light onto a predetermined position inside an object by a converging optical system. In accordance with the laser working apparatus, it is possible to reduce aberration of a laser light generated at a predetermined position inside the object.

Note that, in Patent Document 2, there is described a wavefront compensating apparatus that modulates a laser light with a spatial light modulator, to perform wavefront compensation of the laser light. Further, in Patent Document 3, there is described a laser working apparatus that modulates a laser light with a spatial light modulator, to converge the laser light onto a plurality of positions inside an object.

Patent Document 1: International Publication Pamphlet No. 2005/106564
Patent Document 2: Japanese Published Unexamined Patent Application No. 2005-292662
Patent Document 3: Japanese Published Unexamined Patent Application No. 2006-68762

DISCLOSURE OF THE INVENTION

Problems to be Solved by the Invention

Meanwhile, in a technology of irradiating a plate-shaped object to be processed with a laser light while locating a converging point within the object, so as to form a modified region along a line to cut, a modified region with a low function as a starting point for cutting (for example, it is difficult to generate break) depending on a working condition such as a distance from a laser light entrance surface of the object in some cases.

Then, the present invention has been achieved in consideration of such circumstances, and an object of the present invention is to provide a laser working method capable of reliably forming a modified region serving as a starting point for cutting, and a laser working apparatus and its manufacturing method.

Means for Solving the Problems

In order to attain the above-described object, there is provided a laser working method according to the present invention for irradiating a plate-shaped object to be processed with a laser light while locating a converging point within the object, so as to form a modified region serving as a starting point for cutting along a line to cut the object, in the laser working method, at the time of forming the modified region, the laser light is modulated by a reflection type spatial light modulator such that a wavefront of the laser light becomes a predetermined wavefront inside the object.

Further, there is provided a laser working method according to the present invention for irradiating a plate-shaped object to be processed with a laser light while locating a converging point within the object, so as to form a modified region serving as a starting point for cutting along a line to cut the object, in the laser working method, at the time of forming the modified region, the laser light is modulated by a reflection type spatial light modulator such that aberration of the laser light converged inside the object becomes a predetermined aberration or less.

In these laser working methods, the object is irradiated with the laser light modulated by the reflection type spatial light modulator such that a wavefront of the laser light becomes a predetermined wavefront inside the object (or, aberration of the laser light converged inside the object becomes a predetermined aberration or less). Therefore, for example, aberration of the laser light generated at a position on which a converging point of the laser light is located is made substantially zero, and the energy density of the laser light at that position is enhanced, which makes it possible so as to form a modified region with a high function as a starting point for cutting (for example, it is easy to generate break). In addition, because the reflection type spatial light modulator is used, it is possible to improve the utilization efficiency of a laser light as compared with a transmissive type spatial light modulator. Such improvement of the utilization efficiency of a laser light is particularly important in the case in which a modified region serving as a starting point for cutting is formed in a plate-shaped object to be processed. Accordingly, in accordance with these laser working methods, it is possible to reliably form a modified region serving as a starting point for cutting.

There is provided a laser working method according to the present invention for irradiating a plate-shaped object to be processed with a laser light while locating a converging point within the object, to form modified regions in a plurality of lines serving as starting points for cutting along a line of the object so as to line up in the thickness direction of the object, in the laser working method, at the time of forming the modified regions in one line or a plurality of lines including a modified region farthest from a laser light entrance surface of the object among the modified regions in a plurality of lines, a distance between a converging optical system and the object is changed such that a distance between the converging optical system that converges the laser light inside the object and the object becomes a predetermined distance in accordance with the modified region to be formed, and the laser light is modulated by a reflection type spatial light modulator such that a wavefront of the laser light becomes a predetermined wavefront inside the object.

Further, there is provided a laser working method according to the present invention for irradiating a plate-shaped object to be processed with a laser light while locating a converging point within the object, to form modified regions in a plurality of lines serving as starting points for cutting along a line to cut the object so as to line up in the thickness direction of the object, in the laser working method, at the time of forming the modified regions in one line or a plurality of lines including a modified region farthest from a laser light entrance surface of the object among the modified regions in a plurality of lines, a distance between a converging optical system and the object is changed such that a distance between the converging optical system that converges the laser light inside the object and the object becomes a predetermined distance in accordance with the modified region to be formed, and the laser light is modulated by a reflection type spatial light modulator such that aberration of the laser light converged inside the object becomes a predetermined aberration or less.

In these laser working methods, at the time of forming the modified regions in one line or a plurality of lines including a modified region farthest from the laser light entrance surface of the object among the modified regions in a plurality of lines, the object is irradiated with the laser light modulated by the reflection type spatial light modulator. The reason for that modulation of the laser light by the reflection type spatial light modulator is required at the time of forming the modified region farthest from the laser light entrance surface, is because the farther from the laser light entrance surface the position at which the modified region is formed is, the larger the aberration of the laser light generated at the position on which the converging point of the laser light is located is Accordingly, in accordance with these laser working methods, it is possible to reliably form the modified regions serving as starting points for cutting even in the case in which modified regions in a plurality of lines are formed along one of the lines.

At this time, in the case in which the plurality of lines are set with respect to the object, provided that after the modified regions in a plurality of lines are formed along one of the lines, the modified regions in a plurality of lines are formed along another one of the lines, the following effect is brought about. That is, in a case where there is undulation on the laser light entrance surface of the object, in order to focus the converging point of the laser light on a position at a predetermined distance from the laser light entrance surface with high precision, data on varying levels of the laser light entrance surface along the line is acquired, to fine-adjust a distance between the converging optical system and the object on the basis of the data on varying levels. Accordingly, provided that after the modified regions in a plurality of lines are formed along one of the lines, the modified regions in a plurality of lines are formed along another one of the lines, it is possible to decrease the number of switching data on varying levels, and it is possible to form the modified regions in a plurality of lines along the respective lines at positions at predetermined distances from the laser light entrance surface with high precision.

Further, in the case in which the plurality of lines are set with respect to the object, provided that after the modified region in one line is formed along the plurality of lines, the modified region in another one line is formed along the plurality of lines, the following effect is brought about. That is, in a case where the object breaks by the formation of the modified regions in a plurality of lines along one of the lines, if the modified regions in a plurality of lines are formed along another one of the lines after the modified regions in a plurality of lines are formed along one of the lines, the position of the object is shifted by the break of the object. Then, in order to form the modified regions along the lines with high precision, it is necessary to correct the position of the object. However, if the modified region in another one line is formed along a plurality of lines after the modified region in one line is formed along the plurality of lines, it is possible to prevent the position of the object from being shifted by the break of the object, and the number of corrections for the position of the object is decreased, which makes it possible to form the modified regions in a plurality of lines along the plurality of lines in a short time.

There is provided a laser working method according to the present invention for irradiating a plate-shaped object to be processed with a laser light while locating a converging point within the object, so as to form a modified region serving as a starting point for cutting along a line to cut the object, in the laser working method, at the time of forming the modified region, the laser light is modulated by a reflection type spatial light modulator such that a numerical aperture of the laser light converged inside the object becomes a predetermined numerical aperture.

In this laser working method, the object is irradiated with the laser light modulated by the reflection type spatial light modulator such that a numerical aperture of the laser light converged inside the object becomes a predetermined numerical aperture. Therefore, for example, the modified region with a high function as a starting point for cutting can be formed by changing the numerical aperture of the laser light according to a material of the object, a distance to a position at which the modified region must be formed, or the like.

There is provided a laser working method according to the present invention for irradiating a plate-shaped object to be processed with a laser light while locating a converging point within the object, to form modified regions in a plurality of lines serving as starting points for cutting along a line to cut the object so as to line up in the thickness direction of the object, in the laser working method, at the time of forming the modified regions except for the modified region closest to a laser light entrance surface of the object or an opposed surface opposed to the laser light entrance surface in the object among the modified regions in a plurality of lines, the laser light is modulated by a reflection type spatial light modulator such that a numerical aperture of the laser light converged inside the object is made smaller as compared with the case in which the modified region closest to the laser light entrance surface or the opposed surface is formed.

In this laser working method, at the time of forming the modified region closest to the laser light entrance surface of the object or the opposed surface opposed to the laser light entrance surface in the object, as a modified region particularly important as a starting point for cutting, the object is irradiated with the laser light modulated by the reflection type spatial light modulator such that a numerical aperture of the laser light converged inside the object is made larger as compared with the case in which the other modified regions are formed. Therefore, the modified region closest to the laser light entrance surface of the object or the opposed surface opposed to the laser light entrance surface in the object can be made to be a modified region with an extremely high function as a starting point for cutting (for example, a modified region including break).

At this time, in the case in which the modified regions are formed in at least three lines along the line so as to line up in the thickness direction of the object, at the time of forming the modified regions except for the modified region farthest from the laser light entrance surface and the modified region closest to the laser light entrance surface among the modified regions in at least three lines, the laser light is preferably modulated by the reflection type spatial light modulator such that a numerical aperture of the laser light converged inside the object is made smaller as compared with the case in which the modified region farthest from the laser light entrance surface and the modified region closest to the laser light entrance surface are formed. In this case, at the time of forming the modified region farthest from the laser light entrance surface and the modified region closest to the laser light entrance surface as the modified regions particularly important as starting points for cutting, the object is irradiated with the laser light modulated by the reflection type spatial light modulator such that a numerical aperture of the laser light converged inside the object is made larger as compared with the case in which the modified region therebetween is formed. Therefore, the modified region farthest from the laser light entrance surface and the modified region closest to the laser light entrance surface can be made to be the modified regions with extremely high functions as starting points for cutting (for example, modified regions including break).

There is provided a laser working method according to the present invention for irradiating a plate-shaped object to be processed with a laser light while locating a converging point within the object, so as to form a modified region serving as a starting point for cutting along a line to cut the object, in the laser working method, at the time of forming the modified region, the laser light is modulated by a plurality of reflection type spatial light modulators such that an optical characteristic of the laser light becomes a predetermined optical characteristic.

In this laser working method, the object is irradiated with the laser light modulated by the plurality of reflection type spatial light modulators such that an optical characteristic of the laser light becomes a predetermined optical characteristic. In this way, when a plurality of reflection type spatial light modulators are used, it is possible to control its beam diameter, its optical axis, or the like as an optical characteristic of the laser light. Thereby, it is possible to reliably form the modified region serving as a starting point for cutting.

There is provided a laser working apparatus according to the present invention, that irradiates a plate-shaped object to be processed with a laser light while locating a converging point within the object, so as to form a modified region serving as a starting point for cutting along a line to cut the object, the laser working apparatus includes a supporting base supporting the object, a laser light source emitting the laser light, a reflection type spatial light modulator modulating the laser light emitted from the laser light source, a converging optical system converging the laser light modulated by the reflection type spatial light modulator, inside the object supported by the supporting base, and a controller that, at the time of forming the modified region, controls at least one of the supporting base and the converging optical system such that a converging point of the laser light is located at a predetermined distance from a laser light entrance surface of the object and the converging point of the laser light is relatively moved along the line, and controls the reflection type spatial light modulator such that a wavefront of the laser light becomes a predetermined wavefront inside the object.

In accordance with this laser working apparatus, it is possible to irradiate the object with the laser light modulated by the reflection type spatial light modulator such that a wavefront of the laser light becomes a predetermined wavefront inside the object, along the line. Thereby, it is possible to reliably form the modified region serving as a starting point for cutting. Note that the term "the controller controlling at least one of the supporting base and the converging optical system" includes not only the case in which the controller directly controls at least one of the supporting base and the converging optical system, but also the case in which the controller directly controls at least one of a system including the supporting base and a system including the converging optical system, to indirectly control at least one of the supporting base and the converging optical system.

At this time, the controller preferably stores a control signal for controlling at least one of the supporting base and the converging optical system such that a converging point of the laser light is located at a predetermined distance from the laser light entrance surface for each of the modified regions formed in a plurality of lines along the line so as to line up in the thickness direction of the object, and a control signal for controlling the reflection type spatial light modulator such that a wavefront of the laser light becomes a predetermined wavefront inside the object so as to associate the control signals with each other therein. In this case, a wavefront of the with each of the modified regions in a plurality of lines to be formed.

There is provided a laser working apparatus according to the present invention that irradiates a plate-shaped object to be processed with a laser light while locating a converging point within the object, so as to form a modified region serving as a starting point for cutting along a line to cut the object, the laser working apparatus including: a supporting base supporting the object, a laser light source emitting the laser light, a reflection type spatial light modulator modulating the laser light emitted from the laser light source, a converging optical system converging the laser light modulated by the reflection type spatial light modulator, inside the object supported by the supporting base, and a controller that, at the time of forming the modified region, controls at least one of the supporting base and the converging optical system such that a converging point of the laser light is located at a predetermined distance from a laser light entrance surface of the object and the converging point of the laser light is relatively moved along the line, and controls the reflection type spatial light modulator such that aberration of the laser light converged inside the object becomes a predetermined aberration or less.

In accordance with this laser working apparatus, it is possible to irradiate the object with the laser light modulated by the reflection type spatial light modulator such that aberration of the laser light converged inside the object becomes a predetermined aberration or less, along the line. Thereby, it is possible to reliably form the modified region serving as a starting point for cutting.

At this time, the controller preferably stores a control signal for controlling at least one of the supporting base and the converging optical system such that a converging point of the laser light is located at a predetermined distance from the laser light entrance surface for each of the modified regions formed in a plurality of lines along the line so as to line up in the thickness direction of the object, and a control signal for controlling the reflection type spatial light modulator such that aberration of the laser light converged inside the object becomes a predetermined aberration or less so as to associate the control signals with each other therein. In this case, aberration of the laser light converged inside the object can be made to be a predetermined aberration or less in accordance with each of the modified regions in a plurality of lines to be formed.

There is provided a laser working apparatus according to the present invention that irradiates a plate-shaped object to be processed with a laser light while locating a converging point within the object, so as to form a modified region serving as a starting point for cutting along a line to cut the object, the laser working apparatus including: a supporting base supporting the object, a laser light source emitting the laser light, a plurality of reflection type spatial light modulators modulating the laser light emitted from the laser light source, a converging optical system converging the laser light modulated by the reflection type spatial light modulator, inside the object supported by the supporting base, and a controller that, at the time of forming the modified region, controls at least one of the supporting base and the converging optical system such that a converging point of the laser light is located at a predetermined distance from a laser light entrance surface of the object and the converging point of the laser light is relatively moved along the line, in which the controller has a function of controlling the reflection type spatial light modulator such that an optical characteristic of the laser light becomes a predetermined optical characteristic.

In accordance with this laser working apparatus, because the plurality of reflection type spatial light modulators are provided, it is possible to control its beam diameter, its optical axis, or the like as an optical characteristic of the laser light. Accordingly, even in the case in which the optical axis of the laser light is shifted from any cause, it is possible to easily correct the shift, to reliably form the modified region serving as a starting point for cutting.

There is provided a manufacturing method of a laser working apparatus according to the present invention, the laser working apparatus which includes a supporting base supporting a plate-shaped object to be processed, a laser light source emitting a laser light, a reflection type spatial light modulator modulating the laser light emitted from the laser light source, a converging optical system converging the laser light modulated by the reflection type spatial light modulator, inside the object supported by the supporting base, and a controller controlling the reflection type spatial light modulator, and that irradiates the object with the laser light while locating a converging point within the object, so as to form a modified region serving as a starting point for cutting along a line to cut the object, the manufacturing method of the laser working apparatus including the step of: preparing a standard laser working apparatus and acquiring standard wavefront data by measuring a wavefront of a standard laser light emitted from a standard converging optical system of the standard laser working apparatus, acquiring wavefront data by measuring a wavefront of the laser light emitted from the converging optical system, and calculating a control signal for controlling the reflection type spatial light modulator such that the wavefront of the laser light becomes the wavefront of the standard laser light on the basis of the standard wavefront data and the wavefront data, to store the control signal in the controller.

In accordance with this manufacturing method of the laser working apparatus, by preparing the laser working apparatus capable of forming the modified region with a high function as a starting point for cutting as the standard laser working apparatus, it is possible to make up an individual difference between the apparatuses, and to manufacture the laser working apparatus having the performance equivalent to that of the standard laser working apparatus.

Effect of the Invention

In accordance with the present invention, it is possible to reliably form a modified region serving as a starting point for cutting.

BRIEF DESCRIPTION OF THE DRAWINGS

FIG. 17 is a cross-sectional view of the object of FIG. 16 onto which the laser working method according to the present embodiment is carried out.

FIG. 18 is a cross-sectional view of the object of FIG. 16 onto which the laser working method according to the present embodiment is carried out.

FIG. 20 is an explanatory diagram of the disposition of a reflection type spatial light modulator of the laser working apparatus of FIG. 19.

FIG. 21 is an explanatory diagram of another laser working method according to the present embodiment.

DESCRIPTION OF SYMBOLS

Figure 1:
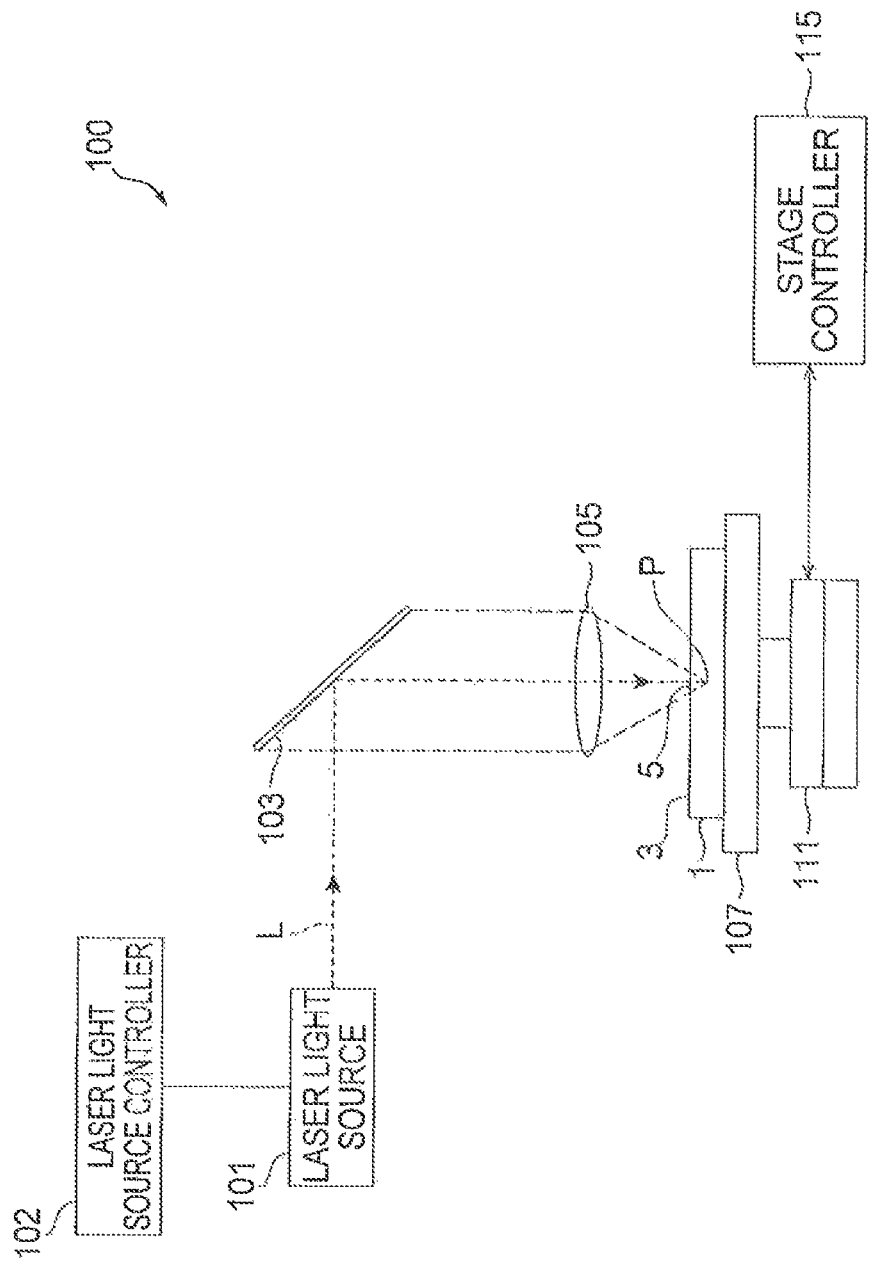
FIG. 1 is a schematic block diagram of a laser working apparatus used for forming a modified region.

1: Object to be processed, 3: Front face (laser light entrance surface), 5: Line to cut, 7, $7_1$ to $7_4$: Modified regions, 200: Laser working apparatus, 200s: Standard laser working apparatus, 201: Supporting base, 202: Laser light source, 203: Reflection type spatial light modulator, 204: Converging optical system, 204s: Standard converging optical system, 205: Controller, L: Laser light, Ls: Standard laser light, P: Converging point.

Best Modes for Carrying out the Invention

Hereinafter, a preferred embodiment of the present invention will be described in detail with reference to the drawings. Note that the same or corresponding portions in the respective drawings are denoted by the same reference numerals and letters, and overlapping descriptions thereof will be omitted.

In a laser working method and a laser working apparatus according to the present embodiment, a plate-shaped object to be processed is irradiated with a laser light while locating a converging point on the object, so as to form a modified region in the object along a line to cut.

Then, first, the formation of a modified region in the laser working method and the laser working apparatus according to the present embodiment will be described with reference to FIGS. 1 to 9.

As shown in FIG. 1, a laser working apparatus 100 is equipped with a laser light source 101 that performs pulsed oscillation of a laser light (laser light for working) L, a dichroic mirror 103 which is disposed so as to change the optical axis of the laser light L in direction by 90 degrees, and a converging lens 105 for converging the laser light L. Further, the laser working apparatus 100 is equipped with a supporting base 107 for supporting an object to be processed 1 irradiated with the laser light L converged by the converging lens 105, a stage 111 for moving the supporting base 107 in the X-, Y-, and Z-axis directions, a laser light source controller 102 that controls the laser light source 101 in order to adjust an output, a pulse width, and the like of the laser light L, and a stage controller 115 that controls the movement of the stage 111.

In this laser working apparatus 100, the laser light L emitted from the laser light source 101 is changed in direction of its optical axis by 90 degrees by the dichroic mirror 103, and is converged inside the object 1 placed on the supporting base 107 by the converging lens 105. At the same time, the stage 111 is moved, to relatively move the object 1 along a line to cut 5 with respect to the laser light L. Thereby, a modified region serving as a starting point for cutting is to be formed in the object 1 along the line 5. Hereinafter, this modified region will be described in detail.

Figure 2:
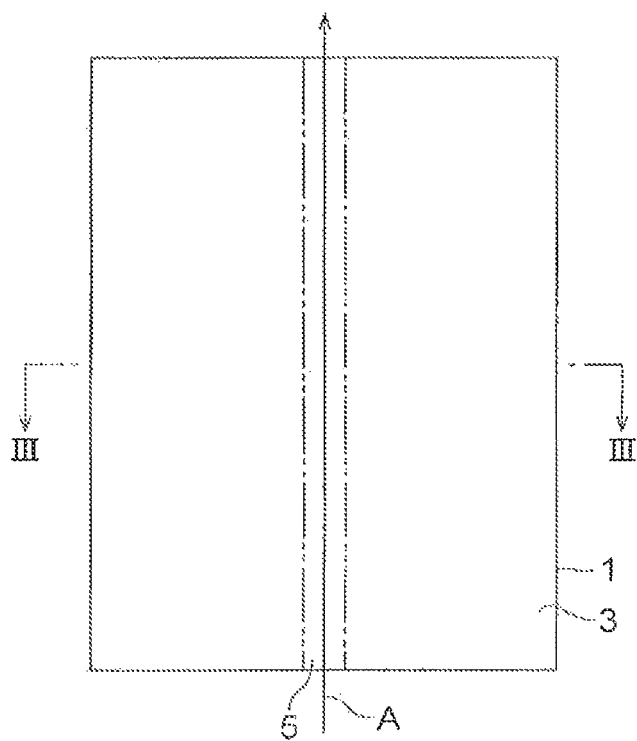
FIG. 2 is a plan view of an object targeted to form a modified region therein.
Figure 3:
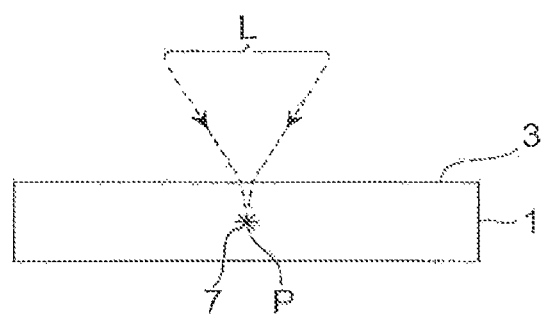
FIG. 3 is a cross-sectional view along the line of the object of FIG. 2.
Figure 4:
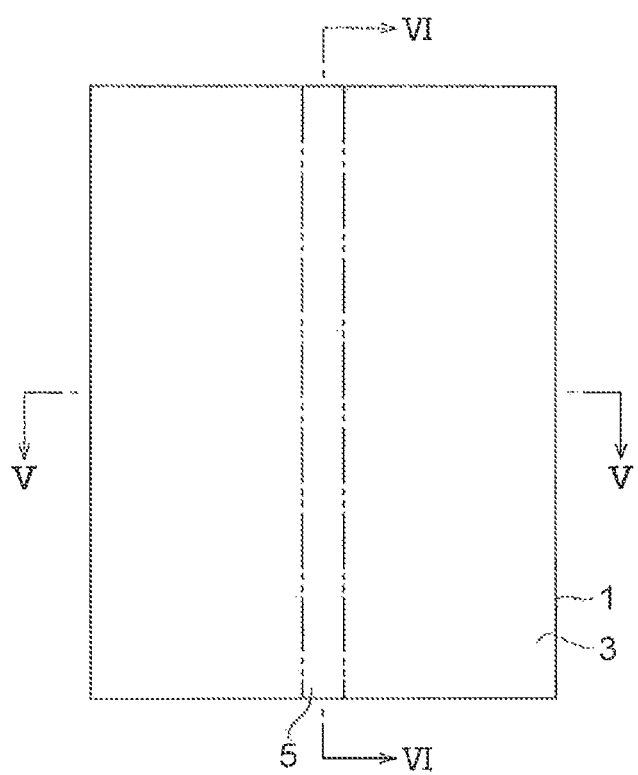
FIG. 4 is a plan view of the object after laser working.
Figure 5:
FIG. 5 is a cross-sectional view along the line V-V of the object of FIG. 4.
Figure 6:
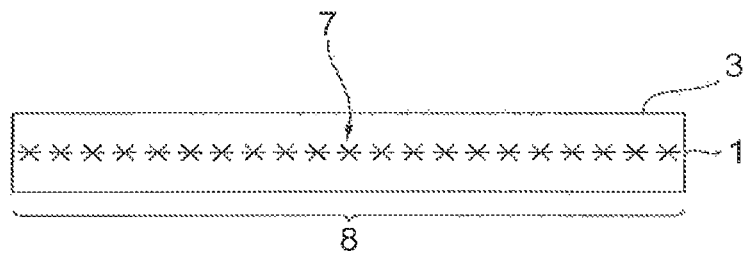
FIG. 6 is a cross-sectional view along the line VI-VI of the object of FIG. 4.

As shown in FIG. 2, the line 5 for cutting the object 1 is set on the plate-shaped object 1. The line 5 is a linearly-extended virtual line. In the case in which a modified region is formed inside the object 1, as shown in FIG. 3, the laser light L is relatively moved along the line 5 (i.e., in the direction of arrow A in FIG. 2) in a state in which a converging point P is located on the inside of the object 1. Thereby, as shown in FIGS. 4 to 6, a modified region 7 is formed inside the object 1 along the line 5, and the modified region 7 formed along the line 5 serves as a starting point region for cutting region 8.

Note that the converging point P is a place on which the laser light L is converged. Further, the line 5 is not limited to a linear shape, and may be a curved shape, and is not limited to a virtual line, and may be a line actually drawn on a front face 3 of the object 1. Further, the modified region 7 is continuously formed in some cases, and is intermittently formed in some cases. Further, it suffices that the modified region 7 is formed at least inside the object 1. Further, crevices are formed from the modified region 7 as a starting point in some cases, and crevices and the modified region 7 may be exposed to the outer surface (the front face, the rear face, or the outer circumferential face) of the object 1.

Incidentally, here, the laser light L is made transmissive through the object 1 and is absorbed particularly in the vicinity of the converging point inside the object 1, and thereby forming the modified region 7 in the object 1 (i.e., internal absorption type laser working). Therefore, the laser light L is hardly absorbed into the front face 3 of the object 1, and thus, the front face 3 of the object 1 does not melt in any case. Generally, in the case in which removal portions such as holes, grooves, and the like are melted and removed from the front face 3 to be formed (surface absorption type laser working), a working region gradually advances from the front face 3 side to the rear face side.

Meanwhile, a modified region formed by the laser working method and the laser working apparatus according to the present embodiment means a region coming into a state different in its density, refractive index, mechanical strength, and other physical characteristics from the circumference thereof. For example, there is a (1) molten processed region, (2) crack region, dielectric breakdown region, (3) refractive index changed region, and the like, and there are also regions where these are mixed.

A modified region by the laser working method and the laser working apparatus according to the present embodiment is formed by a phenomenon such as local absorption or multiple photon absorption of a laser light. When the energy hv of photons is less than the bandgap $E_G$ of absorption of a material, the material is made optically-transparent, which leads to the condition of hv>$E_G$ under which absorption occurs in the material. The multiple photon absorption means a phenomenon that, even if a material is optically-transparent, absorption occurs in the material under the condition of nhv>$E_G$ (n=2, 3, 4, and . . . ) by making the intensity of the laser light L extremely high. The formation of a molten processed region by multiple photon absorption is described in, for example, "Ultrashort Pulse Laser Microprocessing of Silicon" on pages 72 to 73 in Pre-Prints of the National Meeting of JWS (Japan Welding Society) 66 (April, 2000).

Further, as described in D. Du, X. Liu, G. Korn, J. Squier, and G. Mourou, "Laser Induced Breakdown by Impact Ionization in $SiO_2$ with Pulse Widths from 7 ns to 150 fs," Appl Phys Lett 64 (23), Jun. 6, 1994, a modified region formed by utilizing an ultrashort pulse laser light with a pulse width from several picoseconds to femtoseconds may be utilized.

(1) In the Case of a Modified Region Including a Molten Processed Region

An object (for example, a semiconductor material such as silicon) is irradiated with the laser light L under the condition that the electric field intensity at a converging point is $1×10^8$ (W/cm$^2$) or more and its pulse width is 1 µs or less while locating the converging point within the object. Thereby, the laser light L is absorbed in the vicinity of the converging point to locally heat the inside of the object, and a molten processed region is formed inside the object by the heating.

A molten processed region is a region which is once melted and again solidified after that, a region in a currently melt state, or a region in a state of being again solidified from a melt state, or may be called a phase-changed region or a region whose crystalline structure is changed. Further, a molten processed region may be called a region whose certain structure is changed to another structure in a single crystalline structure, an amorphous structure, or a polycrystalline structure. That is, for example, a molten processed region means a region changed to an amorphous structure from its single crystalline structure, a region changed to a polycrystalline structure from its single crystalline structure, and a region changed to a structure including an amorphous structure and a polycrystalline structure from its single crystalline structure. In the case in which an object has a silicon single crystalline structure, a molten processed region has an amorphous silicon structure, for example.

Figure 7:
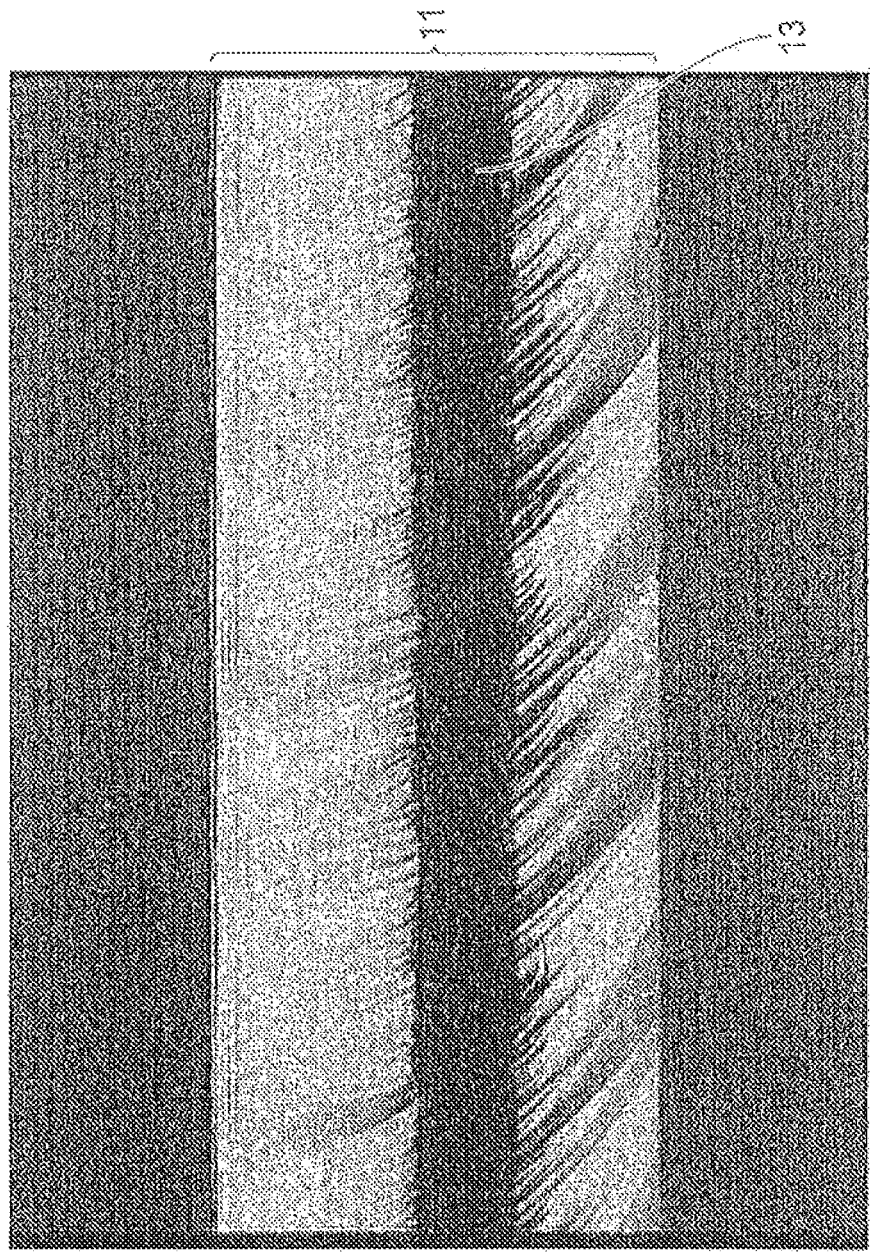
FIG. 7 is a view showing a photograph of a cutting plane of a silicon wafer after laser working.

FIG. 7 is a view showing a photograph of a cross section of one part of a silicon wafer (semiconductor substrate) irradiated with a laser light. As shown in FIG. 7, a molten processed region 13 is formed inside a semiconductor substrate 11.

Figure 8:
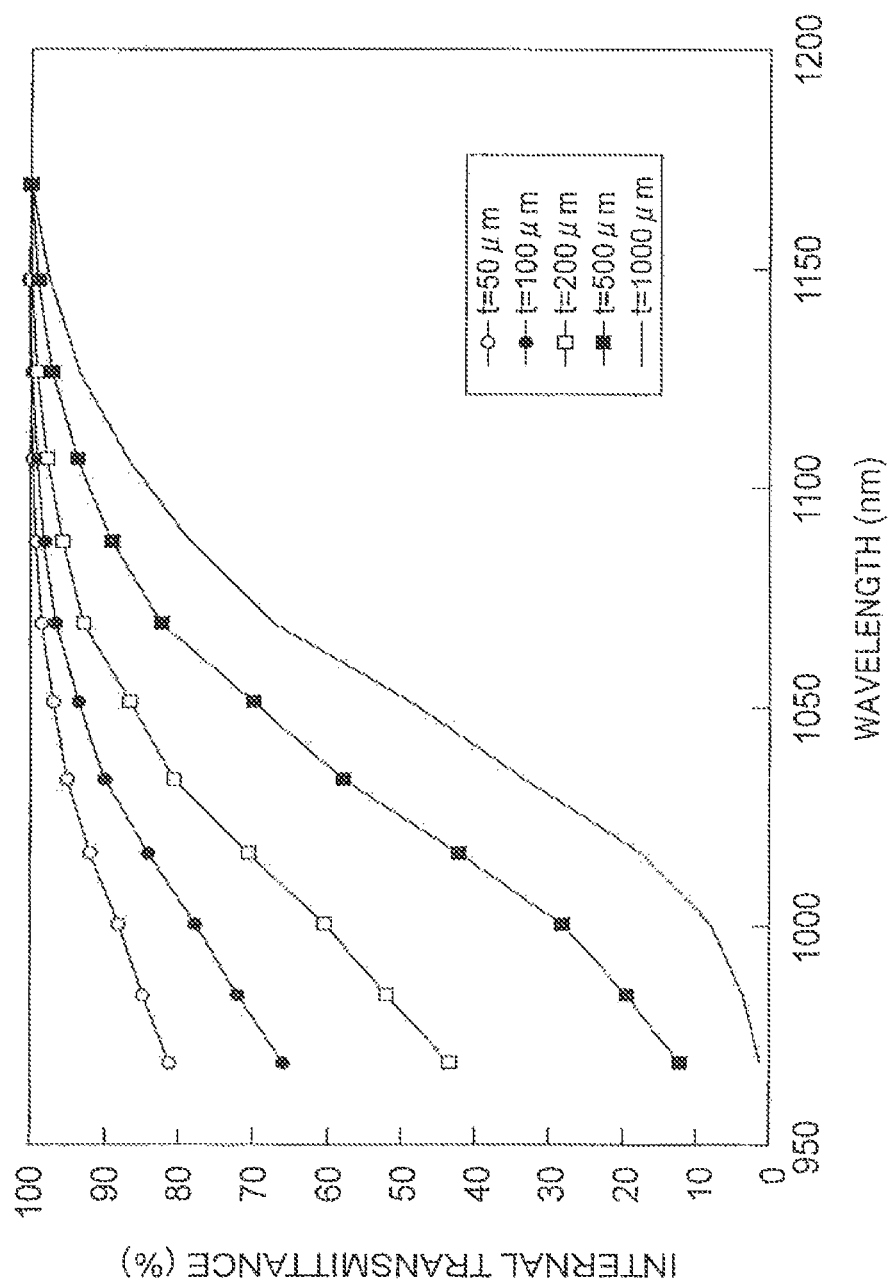
FIG. 8 is a graph showing the relationship between the wavelengths of a laser light and the transmittances inside a silicon substrate.

It will be described that the molten processed region 13 is formed inside a material which is transmissive for a wavelength of a laser light incident thereon. FIG. 8 is a diagrammatic view showing the relationship between wavelengths of a laser light and transmittances inside silicon substrates. However, the respective reflection components on the front face sides and the rear face sides of the silicon substrates are removed, and only the transmittances inside the silicon substrates are shown. The above-described relationships of the respective silicon substrates with thicknesses of 50 μm, 100 μm, 200 μm, 500 μm, and 1000 μm are shown.

For example, it is understood that, in the case in which the thickness of the silicon substrate is 500 μm or less at 1064 nm which is the wavelength of an Nd:YAG laser, 80% or more of the laser light L is made transmissive inside the silicon substrate. Because the thickness of the semiconductor substrate 11 shown in FIG. 7 is 350 μm, the molten processed region 13 is formed in the vicinity of the center of the semiconductor substrate 11, i.e., in the portion 175 μm from the front face. Because the transmittance in this case is 90% or more with reference to a silicon wafer with a thickness of 200 μm, the laser light L is absorbed in a slight quantity inside the semiconductor substrate 11, and most of the laser light L is made transmissive through the semiconductor substrate 11. However, the laser light L is converged inside the silicon wafer under the condition that the peak power density is $1\times10^8$ (W/cm$^2$) or more and its pulse width is 1 μs or less, to cause the laser light to be locally absorbed in the converging point and the vicinity thereof, thereby forming the molten processed region 13 inside the semiconductor substrate 11.

Note that crevices may be generated from a molten processed region as a starting point in a silicon wafer in some cases. Further, a molten processed region may be formed so as to contain crevices in some cases. In this case, the cracks may be formed over the entire surface in the molten processed region, or may be formed only in one portion or in a plurality of portions. Moreover, the crevices may grow naturally in some cases, or may grow by applying force to the silicon wafer in some cases. In the case in which the crevices grow naturally from a molten processed region, there are both the case in which the cracks grow from a state in which the molten processed region is melted, and the case in which the cracks grow when the molten processed region is again solidified from a state in which the molten processed region is melted. However, in any of the cases, the molten processed region is formed inside the silicon wafer, and on its cutting plane, the molten processed region is formed inside the silicon wafer as shown in FIG. 7.

(2) In the Case of a Modified Region Including a Crack Region

An object (for example, glass or a piezoelectric material formed of LiTaO$_3$) is irradiated with the laser light L under the condition that the electric field intensity at a converging point is $1\times10^8$ (W/cm$^2$) or more and its pulse width is 1 μs or less while locating the converging point within the object. This size of a pulse width is the condition under which the laser light L is absorbed into the inside of the object to form a crack region. Thereby, a phenomenon called optical damage inside the object occurs. Thermal strain is induced inside the object by the optical damage, thereby a crack region including one or a plurality of cracks are formed inside the object. A crack region may also be called a dielectric breakdown region.

Figure 9:
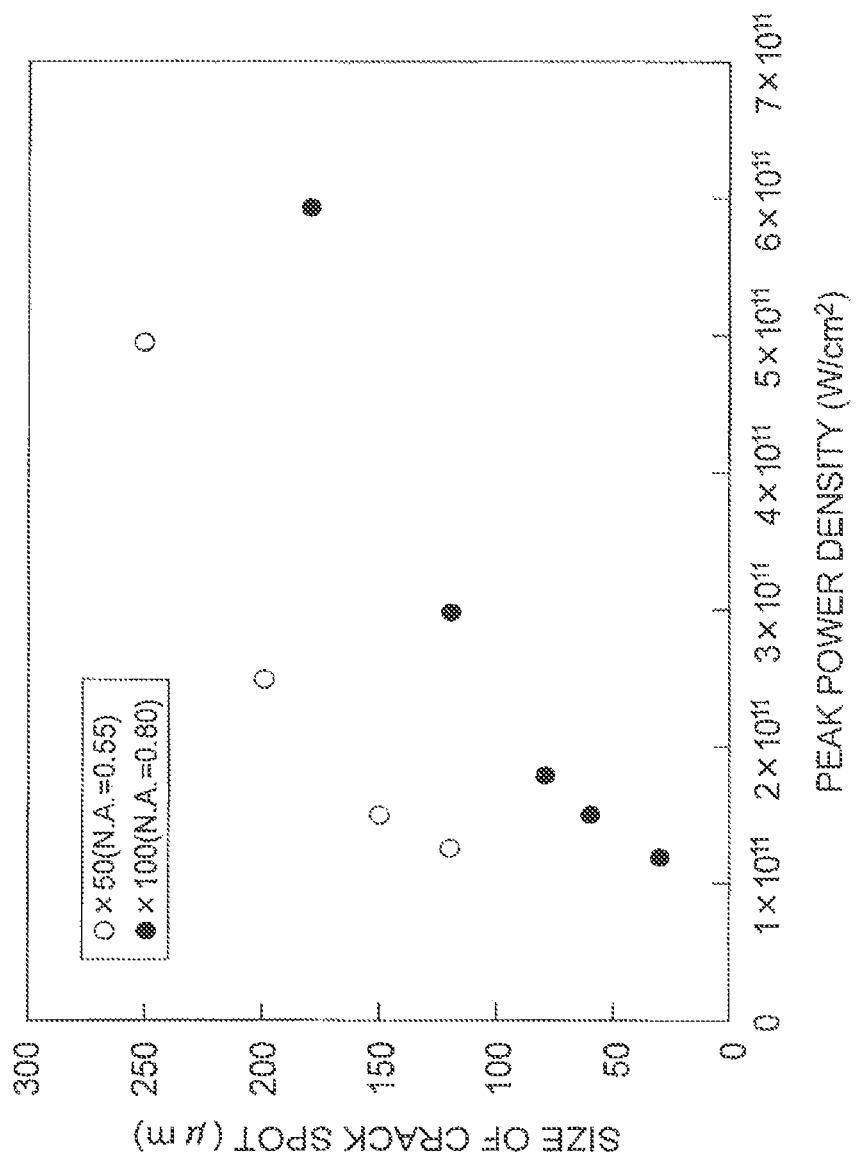
FIG. 9 is a graph showing the relationship between the peak power densities of a laser light and the sizes of crack spots.

FIG. 9 is a diagrammatic view showing the experimental results of the relationship between electric field intensities and sizes of cracks. Peak power densities are plotted on the abscissa, and because the laser light L is a pulse laser light, its electric field intensities are expressed by the peak power densities. The sizes of cracked portions (crack spots) formed inside the object by the laser light L of one pulse are plotted on the ordinate. Crack spots gather to become a crack region. The sizes of crack spots are sizes of portions having the maximum lengths in the shapes of the crack spots. The data shown by black circles in the graph is in the case in which the magnification of the converging lens (C) is 100-times and the numerical aperture (NA) thereof is 0.80. On the other hand, the data shown by white circles in the graph is in the case in which the magnification of the converging lens (C) is 50-times and the numerical aperture (NA) thereof is 0.55. It is understood that the crack spots are generated inside the object from when the peak power density is approximately $10^{11}$ (W/cm$^2$), and crack spots become greater as the peak power density is increased.

(3) In the Case of a Modified Region Including a Refractive Index Changed Region An object (for example, glass) is irradiated with the laser light L under the condition that the electric field intensity at a converging point is $1\times10^8$ (W/cm$^2$) or more and its pulse width is 1 μs or less while locating the converging point within the object. In this way, when the laser light L is absorbed into the inside of the object in a state in which its pulse width is extremely short, the energy thereof is not transformed into thermal energy, and permanent structural changes such as ionic valence change, crystallization, polarization orientation, or the like are induced inside the object, which forms a refractive index changed region.

Note that a modified region including a molten processed region, a dielectric breakdown region, a refractive index changed region, or a region in which these are mixed, may be a region in which the density of a modified region is changed as compared with the density of an unmodified region in its material, or may be a region in which a lattice defect is formed. These may also be collectively called a high-density transfer region.

Further, in some cases, a molten processed region, a refractive index changed region, a region in which the density of a modified region is changed as compared with the density of an unmodified region, and a region in which a lattice defect is formed may further contain crevices (break, microcracks) inside those regions or in the interface between the modified region and the unmodified region. Crevices to be contained may spread over the entire surface of the modified region or are formed in only one portion or a plurality of portions in some cases.

Incidentally, provided that a modified region is formed as follows in consideration of the crystalline structure or the cleavability of the object, it is possible to cut the object with high precision.

That is, in the case of a substrate formed of a single crystalline semiconductor such as silicon having a diamond structure, a modified region is preferably formed in a direction along the (111) plane (first cleavage plane) or the (110) plane (second cleavage plane). Further, in the case of a substrate formed of a III-V group compound semiconductor having a zinc blende structure such as GaAs, a modified region is preferably formed in a direction along the (110) plane. Moreover, in the case of a substrate having a hexagonal crystalline structure such as sapphire ($Al_2O_3$), a modified region is preferably formed in a direction along the (1120) plane (A-plane) or the (1100) plane (M-plane) with the (0001) plane (C-plane) being as a principal plane.

Further, provided that an orientation flat is formed on the substrate along the direction in which a modified region must be formed (for example, a direction along the (111) plane in the single crystalline silicon substrate) described above, or a direction perpendicular to a direction in which the modified region must be formed, it is possible to easily and accurately form a modified region on the substrate by use of the orientation flat as a standard.

Next, the laser working apparatus according to the present embodiment will be described.

Figure 10:
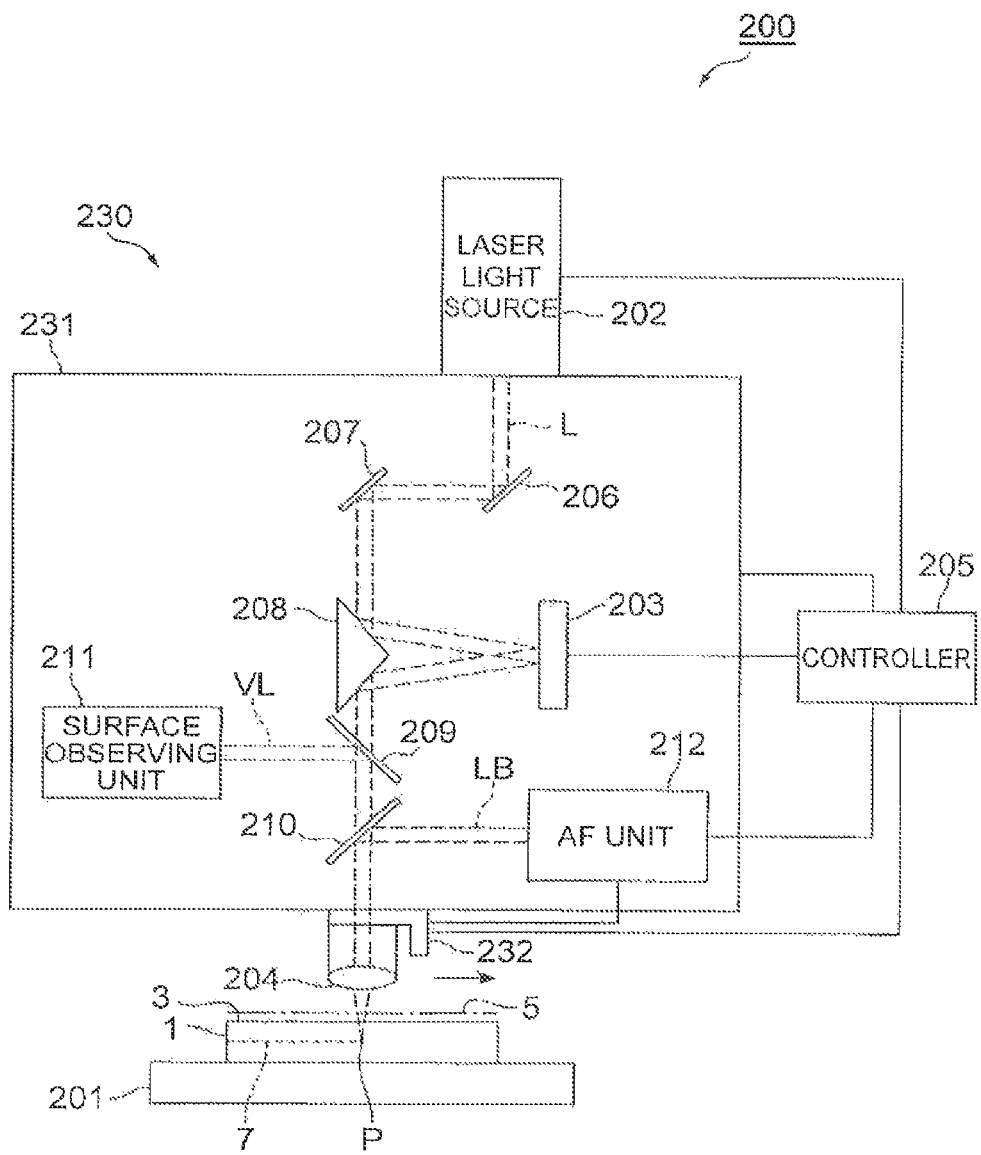
FIG. 10 is a schematic block diagram of a laser working apparatus according to the present embodiment.

As shown in FIG. 10, the laser working apparatus 200 is equipped with a supporting base 201 that supports the plate-shaped object 1, a laser light source 202 that emits the laser light L, a reflection type spatial light modulator 203 that modulates the laser light L emitted from the laser light source 202, a converging optical system 204 that converges the laser light L modulated by the reflection type spatial light modulator 203 inside the object 1 supported by the supporting base 201, and a controller 205 that controls the reflection type spatial light modulator 203. The laser working apparatus 200 is configured to irradiate the object 1 with the laser light L while locating the converging point P within the object 1, to form the modified region 7 serving as a starting point for cutting along the line 5 of the object 1.

The reflection type spatial light modulator 203 is installed in a case 231, and the laser light source 202 is installed on the top panel of the case 231. Further, the converging optical system 204 is composed of a plurality of lenses, and is installed on the bottom panel of the case 231 via a driving unit 232 composed of a piezoelectric element and the like. Then, a laser engine 230 is composed of the parts installed in the case 231. Note that the controller 205 may be installed in the case 231 of the laser engine 230.

A movement mechanism (not shown) that moves the case 231 in the thickness direction of the object 1 is installed in the case 231. Thereby, it is possible to move the laser engine 230 up and down according to a depth of the object 1, which enables to change a position of the converging optical system 204 to converge the laser light L on a desired depth position of the object 1. Note that, in place of installation of the movement mechanism in the case 231, a movement mechanism that moves the supporting base 201 in the thickness direction of the object 1 may be provided to the supporting base 201. Further, the converging optical system 204 may be moved in the thickness direction of the object 1 by utilizing an AF unit 212 which will be described later. Then, these may be combined.

The controller 205 not only controls the reflection type spatial light modulator 203, but also controls the entire laser working apparatus 200. For example, at the time of forming the modified region 7, the controller 205 controls the laser engine 230 including the converging optical system 204 such that the converging point P of the laser light L is located at a predetermined distance from the front face (laser light entrance surface) 3 of the object 1 and the converging point P of the laser light L relatively moves along the line 5. Note that, in order to relatively move the converging point P of the laser light L with respect to the object 1, the controller 205 may control, not the laser engine 230 including the converging optical system 204, but the supporting base 201, or may control both the laser engine 230 including the converging optical system 204 and the supporting base 201.

The laser light L emitted from the laser light source 202 is reflected in sequence by mirrors 206 and 207 in the case 231, and thereafter, the laser light L is reflected by a reflective member 208 such as a prism to be made incident onto the reflection type spatial light modulator 203. The laser light L incident onto the reflection type spatial light modulator 203 is modulated by the reflection type spatial light modulator 203, to be emitted from the reflection type spatial light modulator 203. The laser light L emitted from the reflection type spatial light modulator 203 is reflected by the reflective member 208 so as to be along the optical axis of the converging optical system 204 in the case 231, and the laser light L is made transmissive in sequence through beam splitters 209 and 210 to be made incident onto the converging optical system 204. The laser light L incident onto the converging optical system 204 is converged inside the object 1 placed on the supporting base 201 by the converging optical system 204.

Further, the laser working apparatus 200 is equipped with a surface observing unit 211 for observing the front face 3 of the object 1 in the case 231. The surface observing unit 211 emits a visible light VL which is reflected by the beam splitter 209 to be made transmissive through the beam splitter 210, and detects the visible light VL which is converged by the converging optical system 204 to be reflected by the front face 3 of the object 1, to acquire an image of the front face 3 of the object 1.

Moreover, the laser working apparatus 200 is equipped with the AF (auto-focus) unit 212 for focusing the converging point P of the laser light L on a position at a predetermined distance from the front face 3 with high precision even in a case where there is undulation on the front face 3 of the object 1, in the case 231. The AF unit 212 emits a laser light for auto-focus LB reflected by the beams splitter 210, and detects the laser light for auto-focus LB which is converged by the converging optical system 204 to be reflected by the front face 3 of the object 1, to acquire data on varying levels of the front face 3 along the line 5 by use of, for example, an astigmatic method. Then, at the time of forming the modified region 7, the AF unit 212 causes the driving unit 232 to drive on the basis of the acquired data on varying levels, to move the converging optical system 204 to reciprocate in its optical axis direction so as to be along the undulation of the front face 3 of the object 1, that fine-adjusts a distance between the converging optical system 204 and the object 1.

Figure 11:
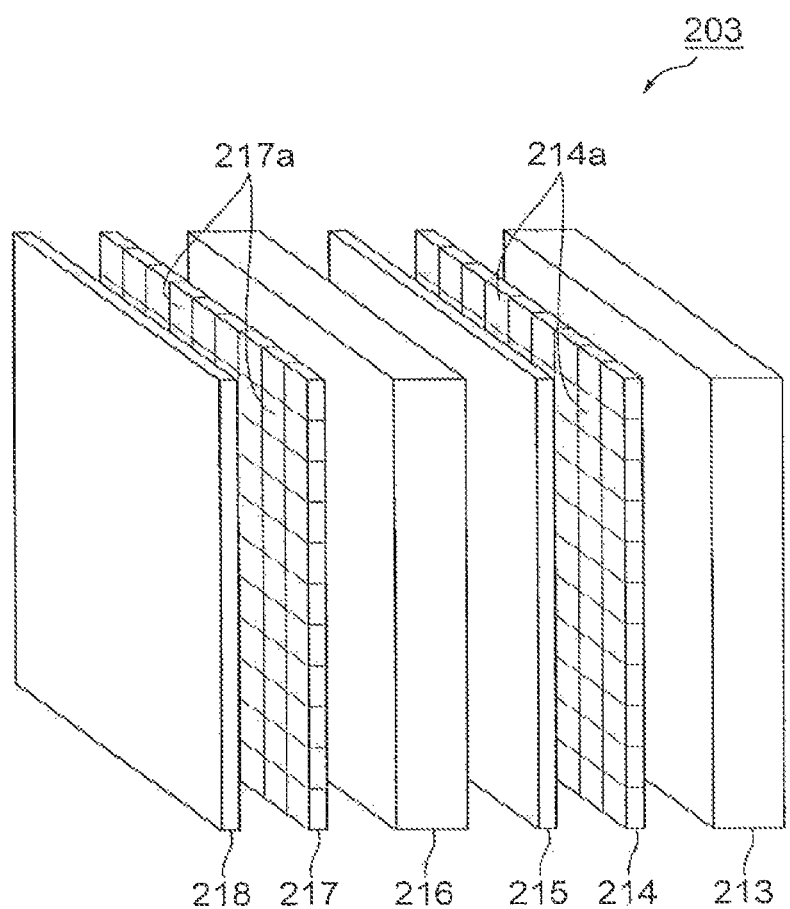
FIG. 11 is an exploded perspective view of a reflection type spatial light modulator of the laser working apparatus of FIG. 10.

Here, the reflection type spatial light modulator 203 will be described. As shown in FIG. 11, the reflection type spatial light modulator 203 is equipped with a silicon substrate 213, a metal electrode layer 214 provided on the silicon substrate 213, a mirror layer 215 provided on the metal electrode layer 214, a liquid crystal layer 216 provided on the mirror layer 215, a transparent electrode layer 217 provided on the liquid crystal layer 216, and a glass plate 218 provided on the transparent electrode layer 217. The metal electrode layer 214 and the transparent electrode layer 217 have a plurality of electrode sections 214a and 217a arranged in a matrix state, and the respective electrode sections 214a of the metal electrode layer 214 and the respective electrode sections 217a of the transparent electrode layer 217 face each other in the laminating direction of the reflection type spatial light modulator 203.

In the reflection type spatial light modulator 203 configured as described above, the laser light L is made transmissive in sequence through the glass plate 218 and the transparent electrode layer 217 from the outside, to be made incident onto the liquid crystal layer 216, and the laser light L is reflected by the mirror layer 215 to be made transmissive in sequence through the transparent electrode layer 217 and the glass plate 218 from the liquid crystal layer 216, to be emitted to the outside. At this time, a voltage is applied to each pair of the electrode sections 214a and 217a facing each other, and a refractive index of a portion sandwiched by the pair of electrode sections 214a and 217a facing each other in the liquid crystal layer 216 is changed according to its voltage. Thereby, shifts in phases of components in a predetermined direction perpendicular to a traveling direction of respective rays in the plurality of respective rays composing the laser light L, is caused to shape (phase-modulate) the laser light L.

At the time of forming the modified region 7, the controller 205 applies a voltage to each pair of the electrode sections 214a and 217a facing each other to control the reflection type spatial light modulator 203 such that aberration of the laser light L converged inside the object 1 becomes a predetermined aberration or less (in other words, the wavefront of the laser light L becomes a predetermined wavefront inside the object 1). The controller 205 inputs wavefront shaping (aberration correction) pattern information for shaping (modulating) a beam pattern (beam wavefront) of the laser light L incident onto the reflection type spatial light modulator 203 to the reflection type spatial light modulator 203. Then, a refractive index of the liquid crystal layer 216 corresponding to each pair of the electrode sections 214a and 217a of the reflection type spatial light modulator 203 is changed by a signal based on the input pattern information, to shape (modulate) the beam pattern (beam wavefront) of the laser light L emitted from the reflection type spatial light modulator 203. Note that pattern information to be input to the reflection type spatial light modulator 203 may be input serially thereto or pattern information stored in advance may be selected to be input thereto.

Meanwhile, strictly speaking, the laser light L modulated (corrected) by the reflection type spatial light modulator 203 is changed in its wavefront form due to its propagation through space. In particular, in the case in which the laser light L emitted from the reflection type spatial light modulator 203 or the laser light L incident onto the converging optical system 204 is a light having a predetermined spread (i.e., a light other than a parallel light), the wavefront form at the reflection type spatial light modulator 203 and the wavefront form at the converging optical system 204 do not match one another, and as a result, precise internal working to be targeted may be interrupted. Therefore, it is important to match the wavefront form at the reflection type spatial light modulator 203 to the wavefront form at the converging optical system 204. For that purpose, it is more desirable that a change in its wavefront form when the laser light L propagates from the reflection type spatial light modulator 203 to the converging optical system 204 is determined by measurement or the like, and wavefront shaping (aberration correction) pattern information taking into account the change in the wavefront form is input to the reflection type spatial light modulator 203.

Figure 23:
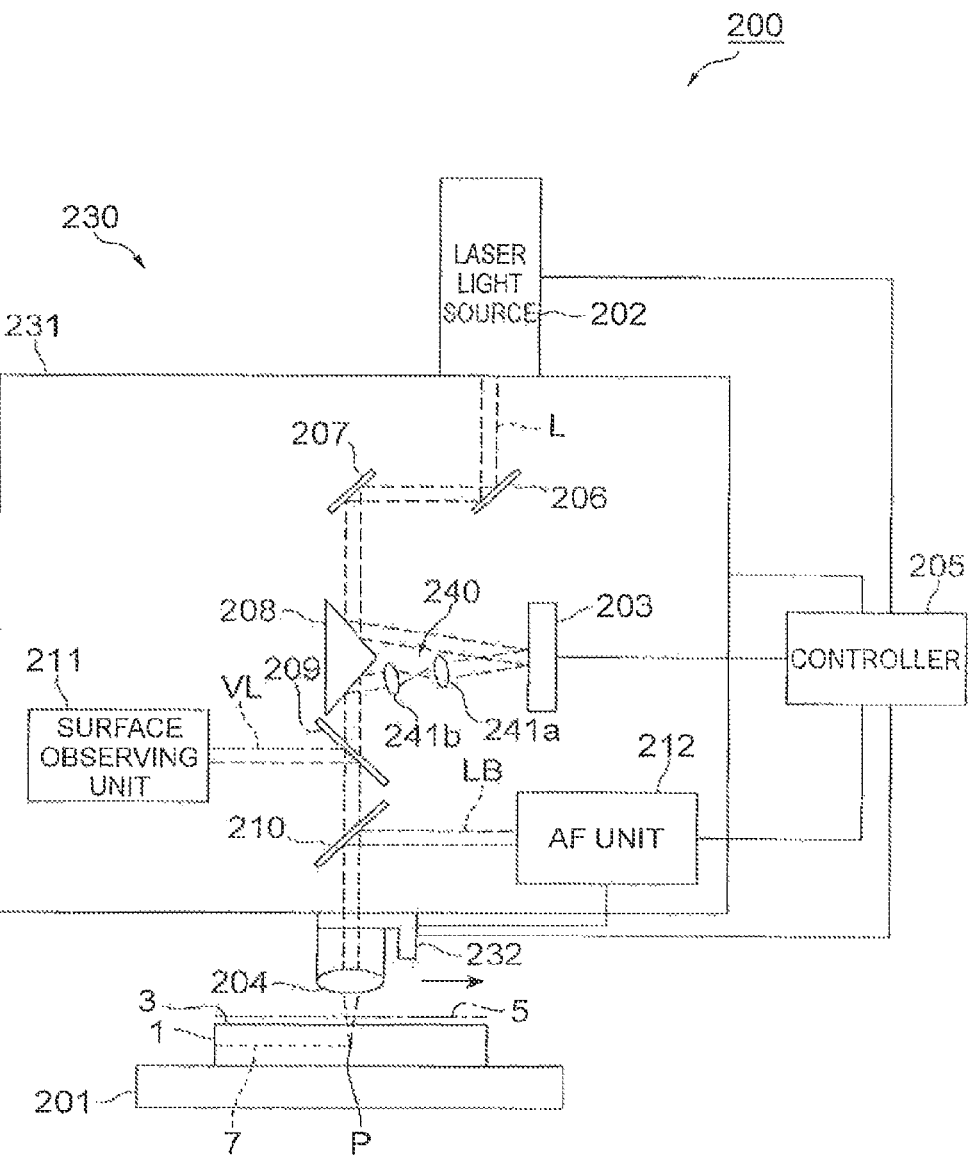
FIG. 23 is a schematic block diagram of another laser working apparatus according to the present embodiment.
Figure 24:
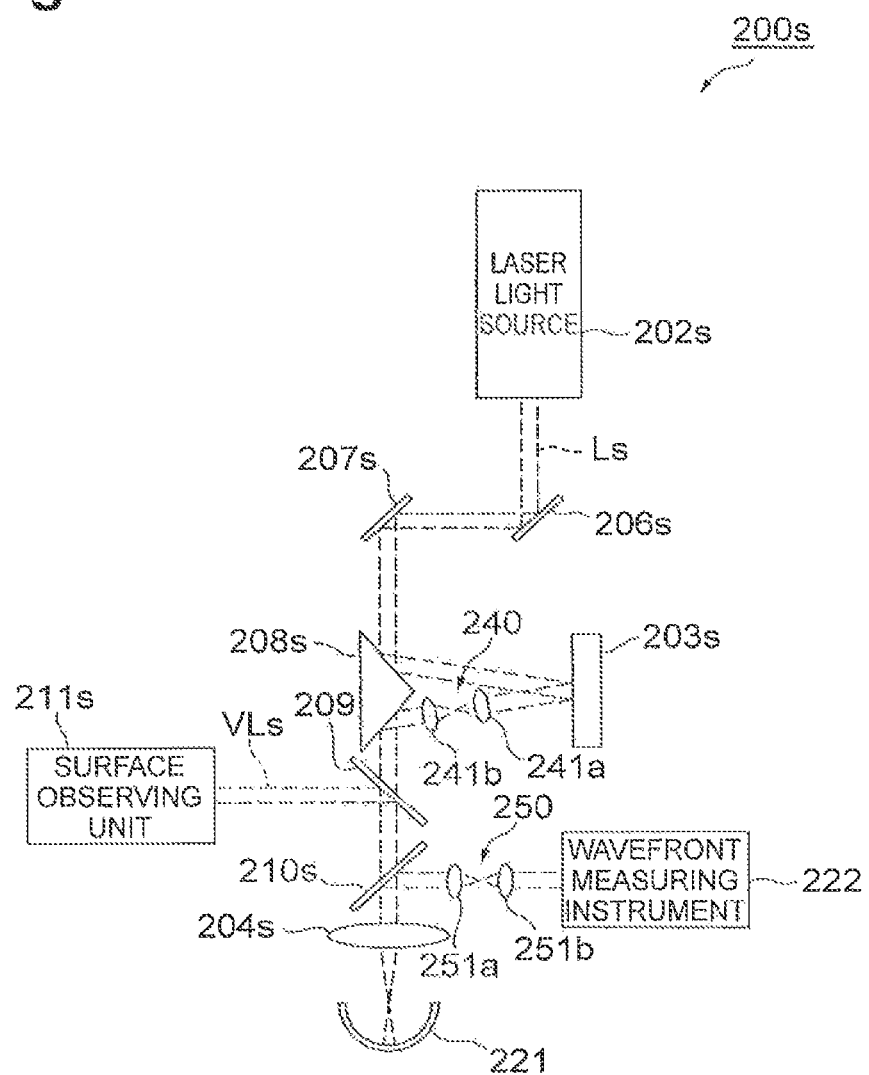
FIG. 24 is a schematic block diagram of another standard laser working apparatus used for the manufacturing method of the laser working apparatus according to the present embodiment.
Figure 25:
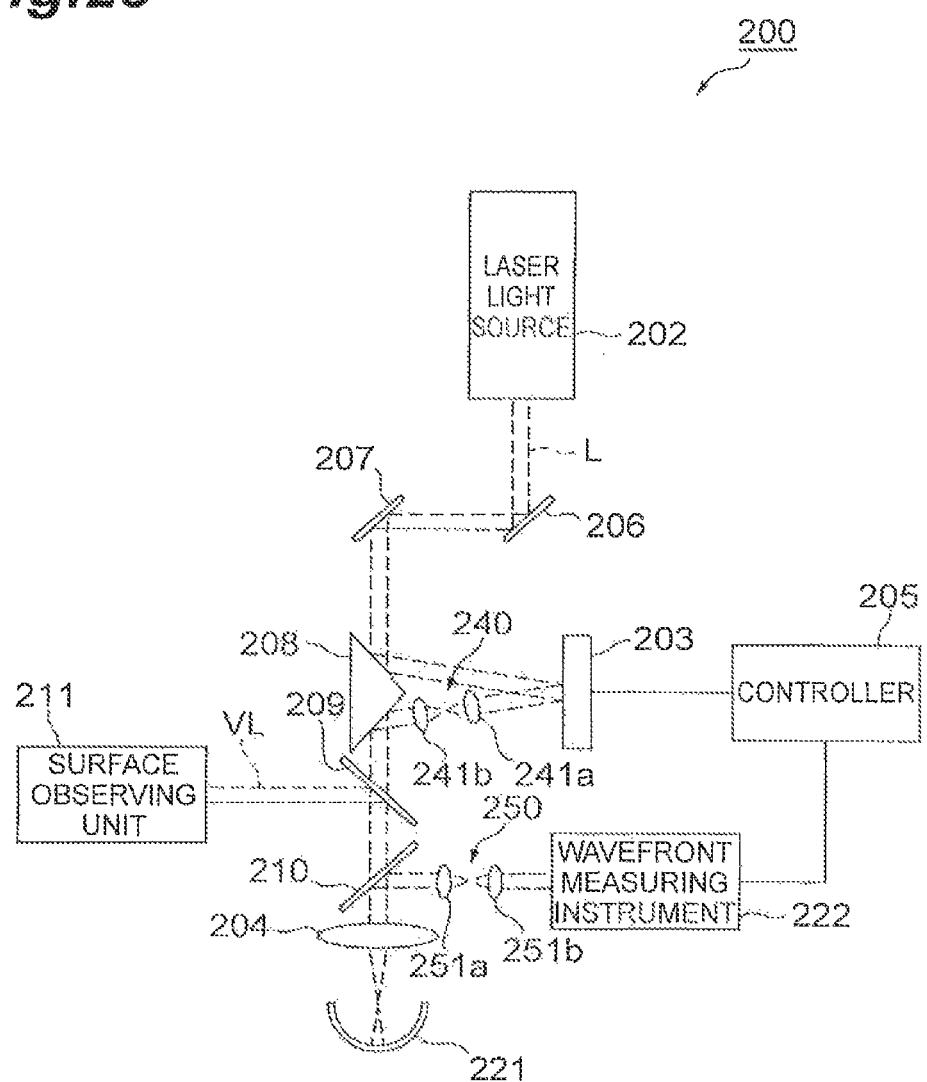
FIG. 25 is a schematic block diagram of another laser working apparatus used for the manufacturing method of the laser working apparatus according to the present embodiment.
Figure 26:
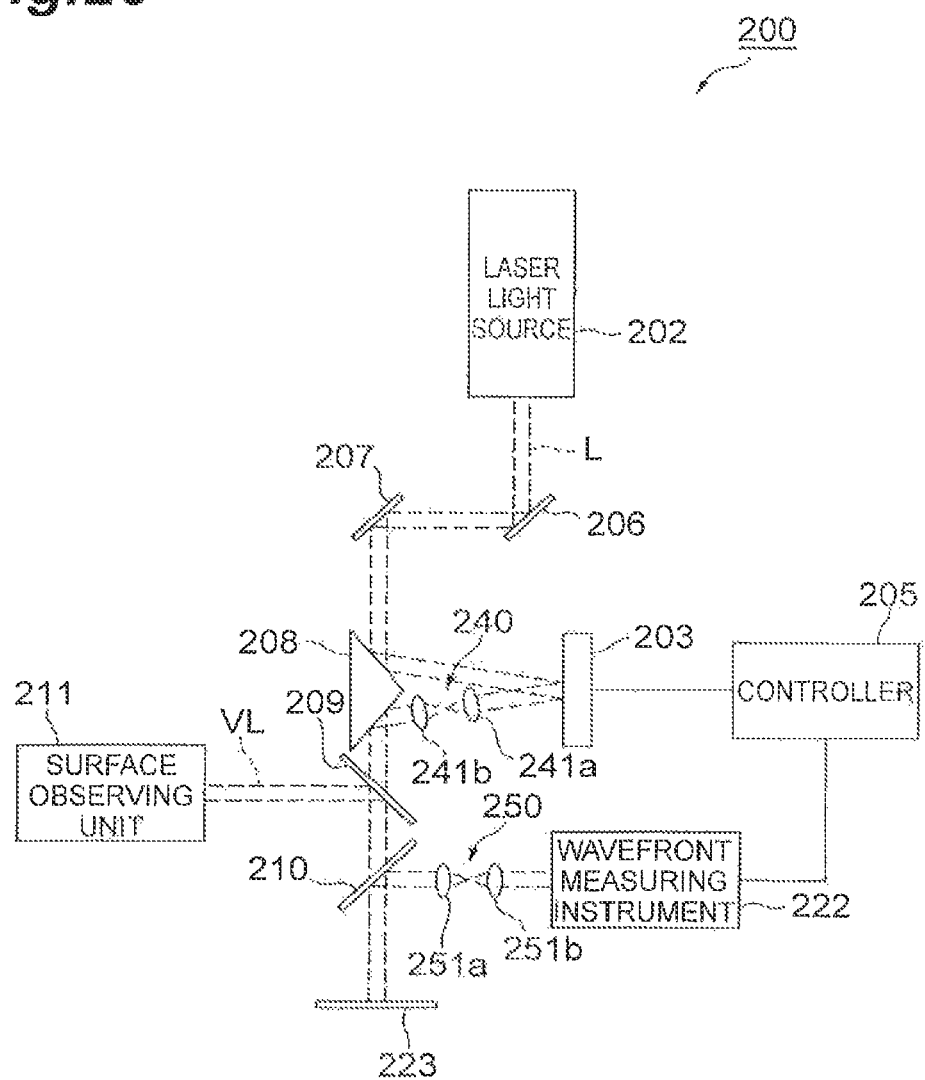
FIG. 26 is a schematic block diagram of yet another laser working apparatus used for the manufacturing method of the laser working apparatus according to the present embodiment.
Figure 27:
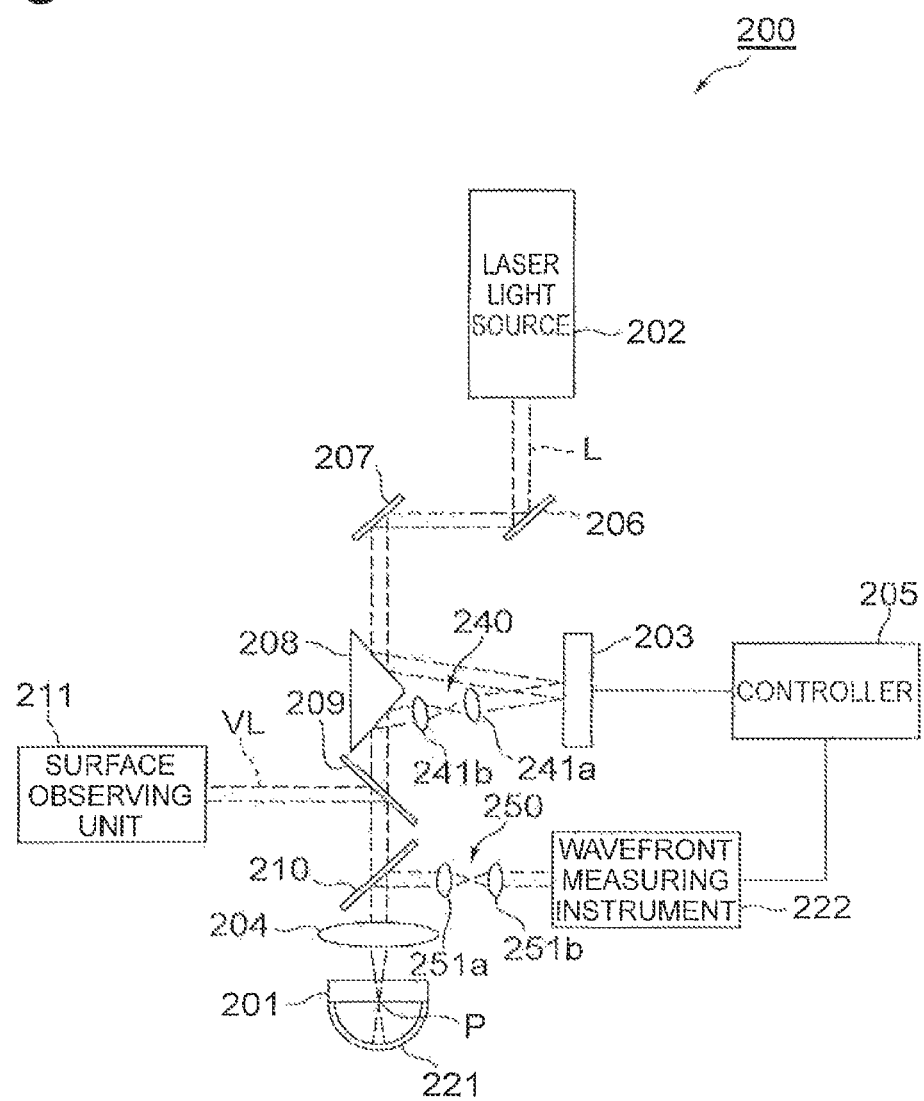
FIG. 27 is a schematic block diagram of yet another laser working apparatus used for the manufacturing method of the laser working apparatus according to the present embodiment.

Or, in order to match the wavefront form at the reflection type spatial light modulator 203 to the wavefront form at the converging optical system 204, as shown in FIG. 23, an adjustment optical system 240 may be provided on the optical path of the laser light L traveling between the reflection type spatial light modulator 203 and the converging optical system 204. Thereby, it is possible to accurately achieve wavefront shaping.

The adjustment optical system 240 has at least two lenses of a lens (first optical element) 241a and a lens (second optical element) 241b. The lenses 241a and 241b are for matching the wavefront form at the reflection type spatial light modulator 203 to the wavefront form at the converging optical system 204 in similarity. The lenses 241a and 241b are disposed between the reflection type spatial light modulator 203 and the reflective member 208 such that a distance between the reflection type spatial light modulator 203 and the lens 241a becomes a focal length (first focal length) f1 of the lens 241a, a distance between the converging optical system 204 and the lens 241b becomes a focal length (second focal length) f2 of the lens 241b, a distance between the lens 241a and the lens 241b becomes f1+f2, and the lens 241a and the lens 241b becomes a double telecentric optical system.

By disposing the lenses 241a and 241b in this way, even if the laser light L has a small spread angle of approximately 1 degree or less, it is possible to align the wavefront at the reflection type spatial light modulator 203 to the wavefront at the converging optical system 204. Note that, in the case of requiring further accuracy, a distance between the liquid crystal layer 216 of the reflection type spatial light modulator 203 and the principal point of the lens 241a is desirably set to f1. However, as shown in FIG. 11, because the reflection type spatial light modulator 203 is extremely thin and a distance between the liquid crystal layer 216 and the glass plate 217 is extremely short, the magnitude of a change in its wavefront form between the liquid crystal layer 216 and the glass plate 217 as well is extremely low. Accordingly, to simplify, from the standpoint of the configuration of the reflection type spatial light modulator 203, a distance between a position at which a focal distance is easily set (for example, the surface (in the vicinity of the surface) of the reflection type spatial light modulator 203) and the lens 241a may be set to f1, thereby making adjustment easy. In addition, in the case of requiring further accuracy, a distance between the primary point of the converging optical system 204 and the primary point of the lens 241b is desirably set to f2. However, the converging optical system 204 is composed of a plurality of lenses, which makes it difficult to perform positioning at the primary points in some cases. In that case, to simplify, from the standpoint of the configuration of the converging optical system 204, a distance between a position at which a focal distance is easily set (for example, the surface (in the vicinity of the surface) of the converging optical system 204) and the lens 241b may be set to f2, thereby making adjustment easy.

Further, a beam diameter of the laser light L is determined by a ratio between f1 and f2 (a beam diameter of the laser light L incident onto the converging optical system 204 is f2/f1 times as long as the beam diameter of the laser light L emitted from the reflection type spatial light modulator 203). Accordingly, in both cases in which the laser light L is a parallel light or a light having a small spread, it is possible to acquire a desired beam diameter in the laser light L incident onto the converging optical system 204 while keeping an angle of the laser light L emitted from the reflection type spatial light modulator 203.

As described above, it is possible to adjust a beam diameter and a spread angle of the laser light L by the adjustment optical system 240. In the laser working method for forming the modified region 7 serving as a starting point for cutting in the object 1, the condition for converging light based on a spread angle or a beam diameter of the laser light L is extremely important as compared with a laser working method for performing working from the surface in order to achieve precise cutting, and in some cases, the laser light L which is not a parallel light, but has a small spread angle (for example, approximately several mrad to several tens of mrad) is necessary for the converging optical system 204 in order to form the modified region 7 suitable for cutting with high precision. Therefore, in order to meet the basic working conditions for forming the modified region 7 in the case in which the reflection type spatial light modulator 203 is installed and in the case in which the reflection type spatial light modulator 203 is not installed, it is necessary to set a beam diameter and a spread angle of the laser light L incident onto the converging optical system 204 (to those in the case in which the reflection type spatial light modulator 203 is not installed).

Then, by use of the adjustment optical system 240, it is possible to converge the laser light L by the converging optical system 204 while maintaining the wavefront (aberration) modulated by the reflection type spatial light modulator 203, and it is possible to form a modified region inside thereof with the laser light L having a predetermined beam diameter and a predetermined spread angle. Thereby, it is possible to efficiently utilize an effective diameter of the converging optical system 204 by the laser light L having a predetermined spread angle, and to form a precise modified region suitable for cutting.

Note that the lenses 241a and 241b of the adjustment optical system 240 are preferably provided on the optical path of the laser light L between the reflection type spatial light modulator 203 and the reflective member 208. The reason for that is as follows. That is, when a light having a large spread (a light between the lens 241a and the lens 241b) is made incident onto the plate-shaped reflective member 208 and the beam splitters 209 and 210, spherical aberration or astigmatism is generated. Accordingly, when the lens 241b is disposed at the subsequent stage of the reflective member 208, a light emitted from the lens 241a to have an angle to the optical axis is made incident onto the reflective member 208 and the beam splitters 209 and 210, to be thereafter made incident onto the lens 241b. Therefore, an accuracy of the laser light L incident onto the converging optical system 204 is lowered under the effect of spherical aberration or astigmatism. Further, the adjustment optical system 240 is desirably equipped with a mechanism that fine-adjusts the respective positions of the lenses 241a and 241b independently. Further, in order to effectively use an effective area of the reflection type spatial light modulator 203, a beam expander may be provided on the optical path of the laser light L between the reflection type spatial light modulator 203 and the laser light source 202.

Next, as a manufacturing method of a laser working apparatus according to the present embodiment, a manufacturing method of the above-described laser working apparatus 200 will be described.

Figure 12:
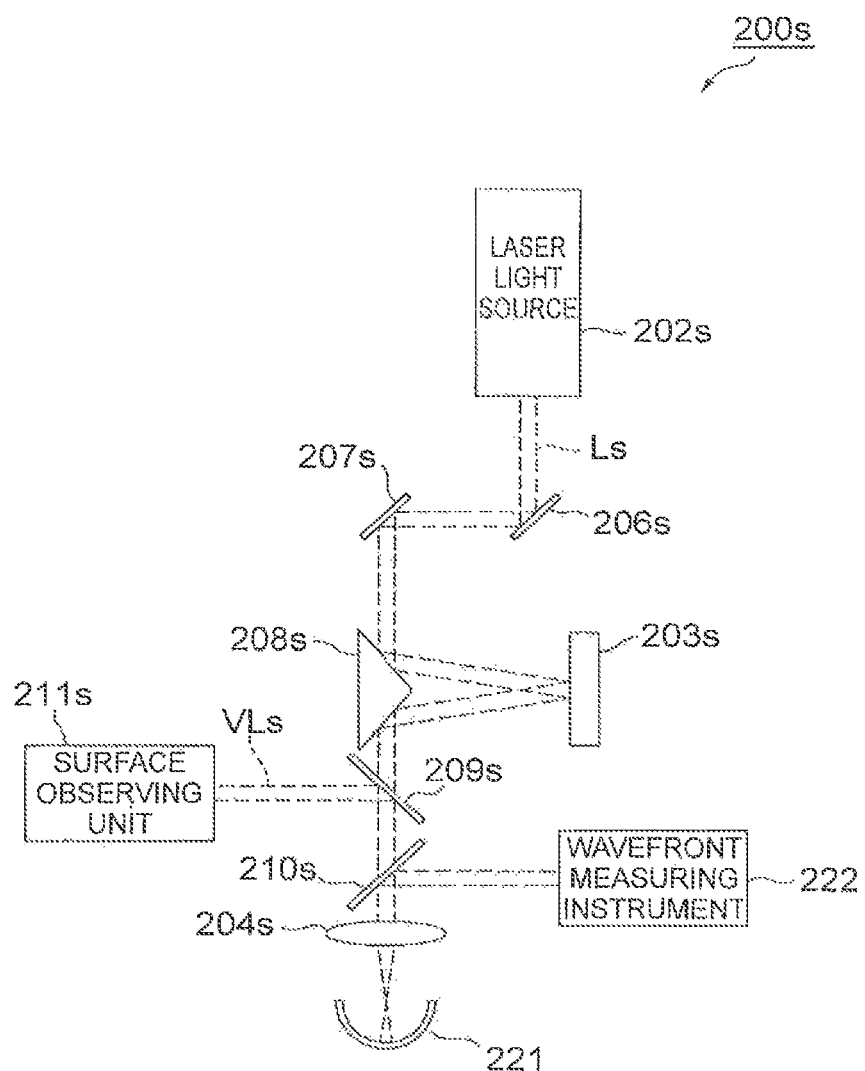
FIG. 12 is a schematic block diagram of a standard laser working apparatus used for a manufacturing method of the laser working apparatus according to the present embodiment.
Figure 13:
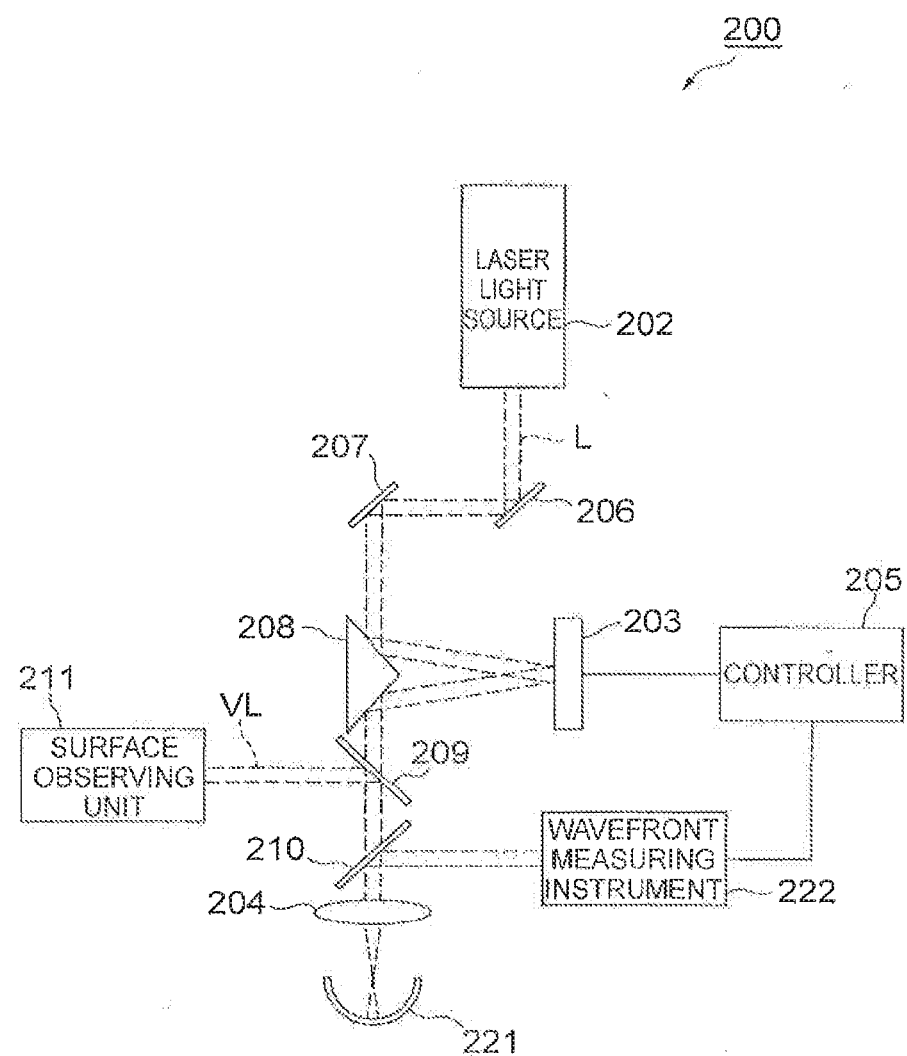
FIG. 13 is a schematic block diagram of the laser working apparatus used for the manufacturing method of the laser working apparatus according to the present embodiment.

First, as shown in FIG. 12, a standard laser working apparatus 200s having a configuration substantially the same as that of the above-described laser working apparatus 200 is prepared. The standard laser working apparatus 200s is a laser working apparatus capable of forming the modified region 7 with a high function as a starting point for cutting, and for example, a laser working apparatus in which an uncut portion has a predetermined percentage or less in the case in which the modified regions 7 are formed along a plurality of lines 5 set in a lattice pattern under a given condition and the object 1 is cut.

With respect to the standard laser working apparatus 200s, a reference spherical mirror 221 is installed in place of the object 1 such that its optical axis matches the optical axis of a standard converging optical system 204s, and a wavefront measuring instrument 222 is installed in place of the AF unit 212. Then, the wavefront of a standard laser light Ls emitted from the standard converging optical system 204s of the standard laser working apparatus 200s is measured by the wavefront measuring instrument 222, to acquire standard wavefront data. Note that the reference spherical mirror 221 is manufactured to an accuracy more than the accuracy of the wavefront measuring instrument 222, and thus, distortion of the wavefront of the standard laser light Ls generated due to the reflection of standard laser light Ls by the reference spherical mirror 221 can be disregarded.

Next, as shown in FIG. 3, the laser working apparatus 200 before the final adjustment, which has the supporting base 201, the laser light source 202, the reflection type spatial light modulator 203, the converging optical system 204, and the controller 205 is prepared.

With respect to the laser working apparatus 200, the reference spherical mirror 221 is installed in place of the object 1 such that its optical axis matches the optical axis of the converging optical system 204, and the wavefront measuring instrument 222 is installed in place of the AF unit 212. Then, the wavefront of the laser light L emitted from the converging optical system 204 of the laser working apparatus 200 is measured by the wavefront measuring instrument 222, to acquire its wavefront data.

Next, a control signal for controlling the reflection type spatial light modulator 203 such that a wavefront of the laser light L becomes the wavefront of the standard laser light Ls is calculated on the basis of the standard wavefront data and the wavefront data, to be stored in the controller 205. In detail, the standard wavefront data and the wavefront data are acquired as Zernike polynomials, and a difference between the Zernike polynomials of the standard wavefront data and the Zernike polynomials of the wavefront data is determined, and a control signal that makes up the difference is calculated, to be stored in the controller 205. For example, in the case in which the Zernike polynomials of the standard wavefront data are "(1×the first term)+(4×the second term)+ (4×the third term)," and the Zernike polynomials of the wavefront data are "(1×the first term)+(2×the second term)+ (4×the third term)," a control signal that further doubles the second term in the Zernike polynomials of the wavefront data is calculated, to be stored in the controller 205.

Note that the reason that the wavefront measuring instrument 222 is not directly disposed on the emission side of the converging optical system 204 to measure the wavefront of the laser light L is as follows. That is, in the case in which the modified region 7 serving as a starting point for cutting is formed by irradiating the plate-shaped object 1 with the laser light L while locating the converging point P within the object 1, the numerical aperture of the laser light L converged inside the object 1 by the converging optical system 204 becomes, for example, 0.55 to 0.80, that is extremely high. Therefore, the intensity of the laser light L weakens or phase differences among the plurality of rays composing the laser light L exceed the measurement limit of the wavefront measuring instrument 222. This reason is also the same in the case in which the wavefront of the standard laser light Ls is measured in the standard laser working apparatus 200s.

As described above, by preparing the laser working apparatus capable of forming the modified region 7 with a high function as a starting point for cutting as the standard laser working apparatus 200s, it is possible to make up an individual difference between the apparatuses, and to manufacture the laser working apparatus 200 having the performance equivalent to that of the standard laser working apparatus 200s.

Figure 14:
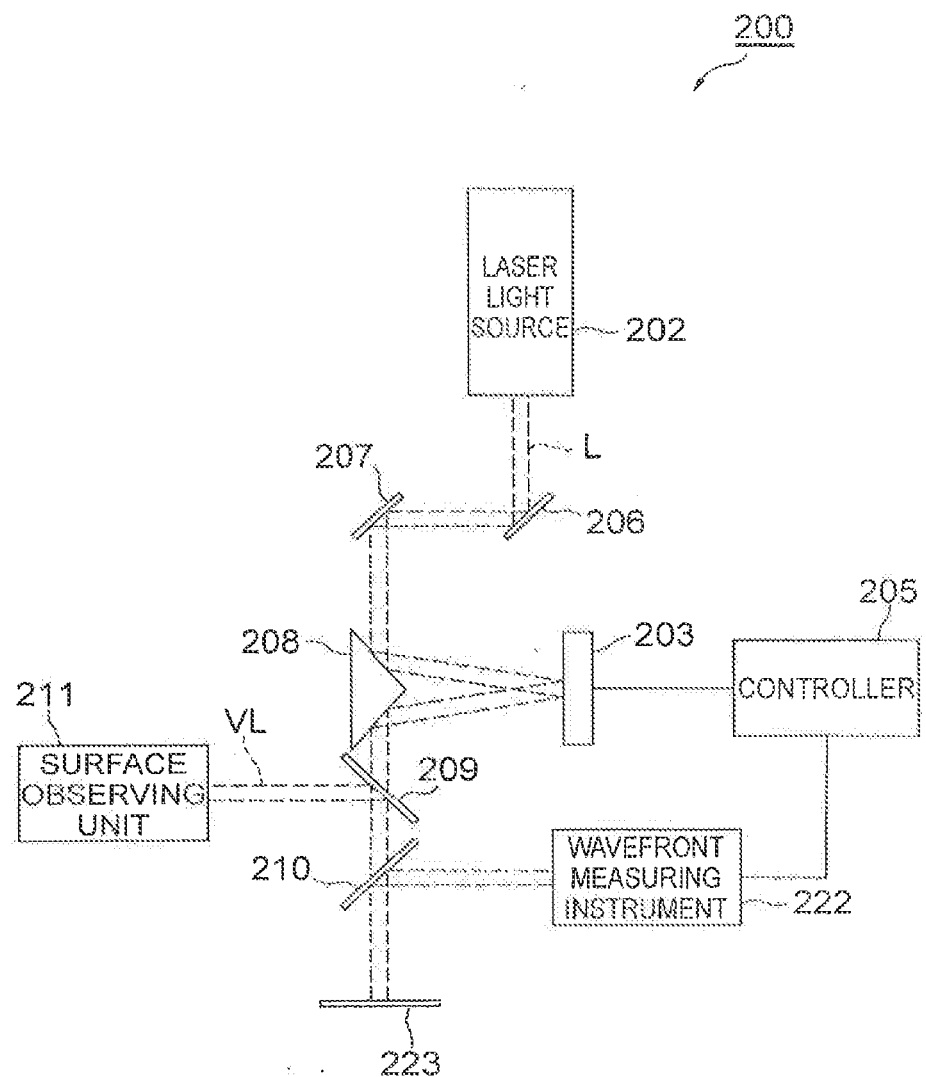
FIG. 14 is a schematic block diagram of the laser working apparatus used for the manufacturing method of the laser working apparatus according to the present embodiment.

Next, as shown in FIG. 14, a reference planar mirror 223 is installed between the beam splitter 210 and the converging optical system 204 so as to be perpendicular to the optical axis of the laser light L in the laser working apparatus 200. Then, the wavefront of the laser light L reflected in sequence by the reference planar mirror 223 and the beam splitter 210 is measured by the wavefront measuring instrument 222, to acquire its wavefront data as Zernike polynomials. Note that the reference planar mirror 223 is manufactured to an accuracy more than the accuracy of the wavefront measuring instrument 222, and thus, distortion of the wavefront of the laser light L generated due to the reflection of the laser light L by the reference planar mirror 223 can be disregarded.

Figure 15:
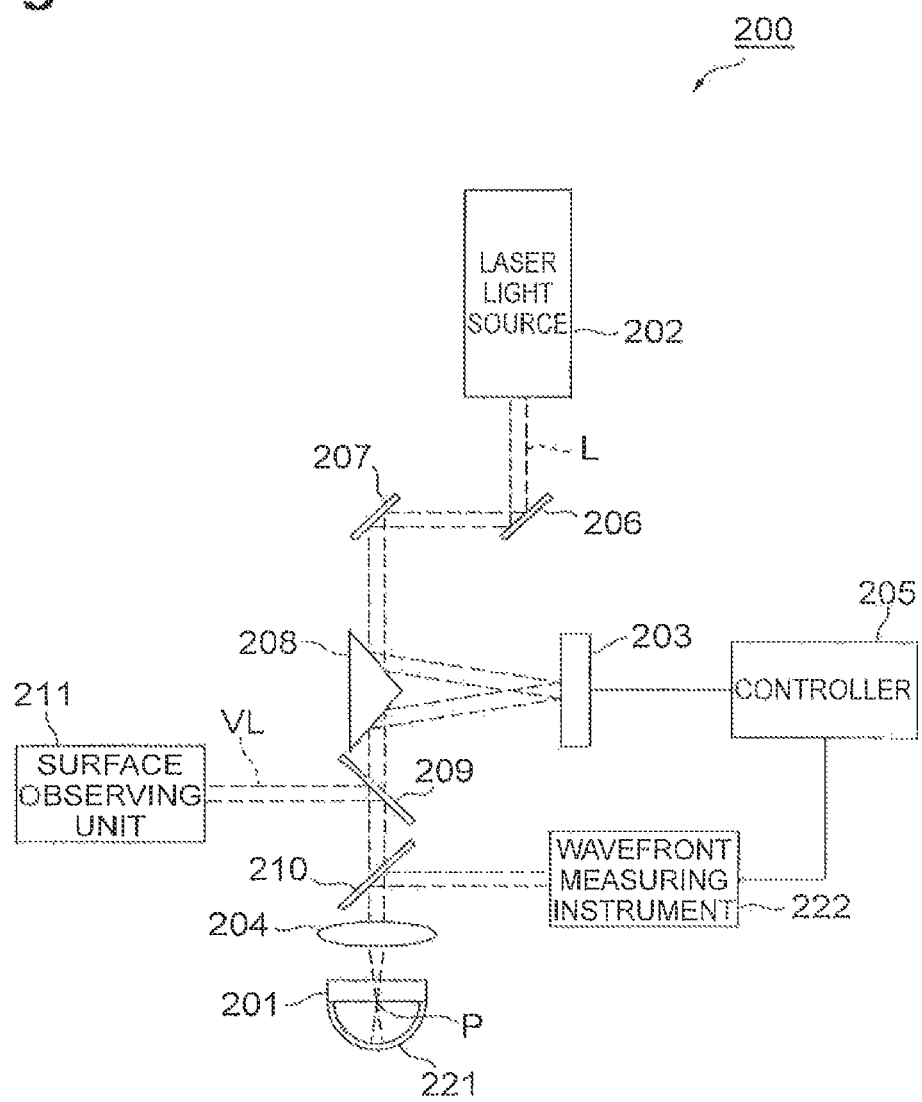
FIG. 15 is a schematic block diagram of the laser working apparatus used for the manufacturing method of the laser working apparatus according to the present embodiment.

Next, as shown in FIG. 15, a reference wafer 224 with a predetermined thickness composed of the same material as the object 1 is prepared, and the reference wafer 224 is installed in the laser working apparatus 200 such that the converging point P of the laser light L converged by the converging optical system 204 is located on the rear face (laser light emitting surface) of the reference wafer 224. Moreover, the reference spherical mirror 221 is installed on the emission side of the reference wafer 224 such that its optical axis matches the optical axis of the converging optical system 204. Then, the wavefront of the laser light L which is made transmissive in sequence through the converging optical system 204 and the reference wafer 224, and is reflected by the reference spherical mirror 221 to be made transmissive in sequence through the reference wafer 224 and the converging optical system 204, and is reflected by the beam splitter 210, is measured by the wavefront measuring instrument 222, to acquire the wavefront data as Zernike polynomials. Note that the reference wafer 224 is manufactured to an accuracy more than the accuracy of the wavefront measuring instrument 222, and thus, distortion of the wavefront of the laser light L generated due to the transmission of the laser light L through the reference wafer 224 can be disregarded.

Next, a difference between the Zernike polynomials of the wavefront data acquired in the state of FIG. 14 and the Zernike polynomials of the wavefront data acquired in the state of FIG. 15 is determined. Thereby, it is possible to cancel the distortion of the wavefront even if the wavefront of the laser light L is distorted by the reflection thereof by the beam splitter 210. Then, a control signal for controlling the reflection type spatial light modulator 203 such that a difference between the Zernike polynomials becomes a predetermined difference or less (that is, in the case in which the converging point P of the laser light L is located at a predetermined distance (which is equal to a predetermined thickness of the reference wafer 224) from the front face 3 of the object 1, the aberration of the laser light L generated at that position becomes a predetermined aberration or less), is calculated.

Note that if a difference between the Zernike polynomials is a predetermined difference or less, a control signal for controlling the reflection type spatial light modulator 203 is made unnecessary. Further, a control signal for controlling the reflection type spatial light modulator 203 such that a difference between the Zernike polynomials becomes substantially zero (that is, in the case in which the converging point P of the laser light L is located at a predetermined distance (which is equal to a predetermined thickness of the reference wafer 224) from the front face 3 of the object 1, the aberration of the laser light L generated at that position becomes substantially zero), may be calculated.

The calculations for control signals for controlling the reflection type spatial light modulator 203 are executed, for example, while changing the predetermined thickness of the reference wafer 224 gradually by 50 µm from 50 µm to 700 µm. Then, the control signal for controlling the reflection type spatial light modulator 203 such that aberration of the laser light L converged inside the object 1 becomes a predetermined aberration or less (in other words, the wavefront of the laser light L becomes a predetermined wavefront inside the object 1), is stored in the controller 205 so as to be associated with a control signal for controlling the laser engine 230 including the converging optical system 204 such that the converging point P of the laser light L is located at a predetermined distance from the front face 3 of the object 1.

Thereby, in the case in which the modified regions 7 are formed in a plurality of lines so as to line up in the thickness direction of the object 1 with respect to one of the lines 5, aberration of the laser light L converged inside the object 1 can be made to be a predetermined aberration or less in accordance with each of the modified regions 7 in a plurality of lines to be formed (in other words, the wavefront of the laser light L can be made to be a predetermined wavefront inside the object 1).

Meanwhile, strictly speaking, the laser light L modulated (corrected) by the reflection type spatial light modulators 203 and 203s is changed in its wavefront form due to its propagation through space. In particular, in the case in which the laser light L emitted from the reflection type spatial light modulators 203 and 203s or the laser light L incident onto the converging optical systems 204 and 204s is a light having a predetermined spread (i.e., a light other than a parallel light), the wavefront form at the reflection type spatial light modulators 203 and 203s and the wavefront form at the converging optical systems 204 and 204s do not match one another, and as a result, precise internal working to be targeted may be interrupted. Therefore, it is necessary to match the wavefront form at the reflection type spatial light modulators 203 and 203s to the wavefront form at the converging optical systems 204 and 204s. Further, it is also important to match the wavefront form at the converging optical systems 204 and 204s to the wavefront form at the wavefront measuring instrument 222, and to match the wavefront form at the reflection type spatial light modulators 203 and 203s to the wavefront form at the wavefront measuring instrument 22. For that purpose, it is more desirable that a change in its wavefront form when the laser light L propagates from the reflection type spatial light modulators 203 and 203s to the converging optical systems 204 and 204s is determined by measurement or the like, and wavefront shaping (aberration correction) pattern information taking into account the change in the wavefront form is input to the reflection type spatial light modulators.

Or, in order to match the wavefront form at the reflection type spatial light modulators 203 and 203s to the wavefront form at the converging optical systems 204 and 204s, by providing adjustment optical systems 240 and 250 as shown in FIGS. 24 to 27, it is possible to achieve more accurate wavefront shaping. The manufacturing method of the laser working apparatus shown in FIGS. 24 to 27 is basically the same as the manufacturing method of the laser working apparatus shown in FIGS. 12 to 15. The difference being in the point that there are the adjustment optical systems 240 and 250.

First, the adjustment optical system 240 has at least two lenses 241a and 241b. The lenses 241a and 241b are for matching the wavefront form at the reflection type spatial light modulators 203 and 203s to the wavefront form at the converging optical systems 204 and 204s in similarity. The lenses 241a and 241b are disposed between the reflection type spatial light modulator 203 and the reflective member 208 such that a distance between the reflection type spatial light modulator 203 and the lens 241a becomes a focal length f1 of the lens 241a, a distance between the converging optical system 204 and the lens 241b becomes a focal length f2 of the lens 241b, a distance between the lens 241a and the lens 241b becomes f1+f2, and the lens 241a and the lens 241b becomes a double telecentric optical system.

By disposing the lenses 241a and 241b in this way, even if the laser light L has a small spread angle, it is possible to align the wavefront form at the reflection type spatial light modulators 203 and 203s to the wavefront form at the converging optical systems 204 and 204s.

A beam diameter of the laser light L is determined by a ratio between f1 and f2 (a beam diameter of the laser light L incident onto the converging optical systems 204 and 204s is f2/f1 times as long as the beam diameter of the laser light L emitted from the reflection type spatial light modulators 203 and 203s). Accordingly, in both cases in which the laser light L is a parallel light or a light having a small spread, it is possible to acquire a desired beam diameter in the laser light L incident onto the converging optical systems 204 and 204s while keeping an angle of the laser light L emitted from the reflection type spatial light modulators 203 and 203s.

Further, the adjustment optical system 250 has at least two lenses 251a and 251b. The lenses 251a and 251b are for matching the wavefront form at the converging optical systems 204 and 204s or the reference planar mirror 223 and the wavefront form at the wavefront measuring instrument 222 in similarity. Note that the disposition of the adjustment optical system 250 is based on the same technical idea for the adjustment optical system 240. Further, the adjustment optical systems 240 and 250 are desirably equipped with mechanisms that fine-adjust the respective positions of the lenses respectively provided thereto independently.

Next, as a laser working method according to the present embodiment, a laser working method carried out in the above-described laser working apparatus 200 will be described.

Figure 16:
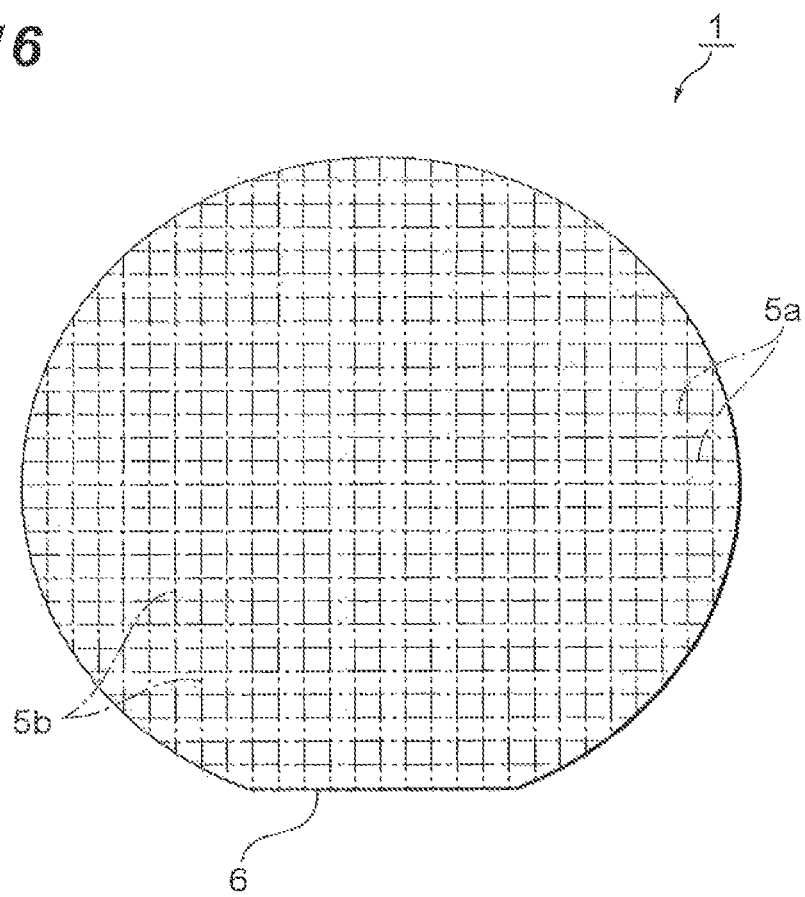
FIG. 16 is a plan view of an object targeted for a laser working method according to the present embodiment.

First, the object 1 is prepared. The object 1 is, as shown in FIG. 16, a semiconductor substrate with a thickness of 300 μm, which is composed of silicon, for example. A plurality of function elements (not shown) arranged in a matrix state are generally formed in a direction parallel to and in a direction perpendicular to an orientation flat 6 on the front face of the semiconductor substrate. Note that the function elements are, for example, semiconductor operational layers formed by crystal growth, light-receiving elements such as photodiodes or the like, light-emitting elements such as laser diodes or the like, or circuit elements formed as circuits, or the like.

Next, the object 1 is fixed on the supporting base 201 of the laser working apparatus 200. Then, a plurality of lines 5a extending in a direction parallel to the orientation flat 6 and a plurality of lines 5b extending in a direction perpendicular to the orientation flat 6 are set in a lattice pattern so as to pass between the adjacent function elements. Here, the converging point P of the laser light L is made to be located 270 μm, 210 μm, 150 μm, and 50 μm from the front face 3 of the object 1, to form the modified regions 7 including molten processed regions in four lines along the respective lines 5a and 5b so as to line up in the thickness direction of the object 1.

First, the controller 205 outputs a control signal for controlling the position of the laser engine 230 including the converging optical system 204, to control the laser engine 230 including the converging optical system 204 such that the converging point P of the laser light L is located 270 μm from the front face 3 of the object 1 as shown in FIG. 17A. Then, the controller 205 controls the laser engine 230 including the converging optical system 204 such that the converging point P of the laser light L is relatively moved along one of the lines 5a. At the same time, the controller 205 outputs a control signal for controlling the reflection type spatial light modulator 203, to control the reflection type spatial light modulator 203 such that aberration of the laser light L converged inside the object 1 becomes a predetermined aberration or less. Thereby, the modified region $7_1$ serving as a starting point for cutting along the one of the lines 5a is formed.

Note that the control signal for controlling the reflection type spatial light modulator 203 is stored in the controller 205 so as to be associated with the control signal for controlling the position of the laser engine 230 including the converging optical system 204 such that the converging point P of the laser light L is located 270 μm from the front face 3 of the object 1.

Next, the controller 205 outputs a control signal for controlling the laser engine 230 including the converging optical system 204, to control the laser engine 230 including the converging optical system 204 such that the converging point P of the laser light L is located 210 μm from the front face 3 of the object 1 as shown in FIG. 17B. Then, the controller 205 controls the laser engine 230 including the converging optical system 204 such that the converging point P of the laser light L is relatively moved along the same one line 5a. At the same time, the controller 205 outputs a control signal for controlling the reflection type spatial light modulator 203, to control the reflection type spatial light modulator 203 such that aberration of the laser light L converged inside the object 1 becomes a predetermined aberration or less. Thereby, the modified region $7_2$ serving as a starting point for cutting along the same one line 5a is formed.

Note that the control signal for controlling the reflection type spatial light modulator 203 is stored in the controller 205 so as to be associated with the control signal for controlling the position of the laser engine 230 including the converging optical system 204 such that the converging point P of the laser light L is located 210 μm from the front face 3 of the object 1. Further, the direction in which the converging point P of the laser light L is relatively moved along the line 5a may be a direction opposite to that in the case of forming the modified region $7_1$ in order to improve the speed of forming the modified region $7_2$.

Next, the controller 205 outputs a control signal for controlling the laser engine 230 including the converging optical system 204, to control the laser engine 230 including the converging optical system 204 such that the converging point P of the laser light L is located 150 µm from the front face 3 of the object 1 as shown in FIG. 18A. Then, the controller 205 controls the laser engine 230 including the converging optical system 204 such that the converging point P of the laser light L is relatively moved along the same one line 5a. At the same time, the controller 205 outputs a control signal for controlling the reflection type spatial light modulator 203, to control the reflection type spatial light modulator 203 such that aberration of the laser light L converged inside the object 1 becomes a predetermined aberration or less. Thereby, the modified region $7_3$ serving as a starting point for cutting along the same one line 5a is formed.

Note that the control signal for controlling the reflection type spatial light modulator 203 is stored in the controller 205 so as to be associated with the control signal for controlling the position of the laser engine 230 including the converging optical system 204 such that the converging point P of the laser light L is located 150 µm from the front face 3 of the object 1. Further, the direction in which the converging point P of the laser light L is relatively moved along the line 5a may be a direction opposite to that in the case of forming the modified region $7_2$ in order to improve the speed of forming the modified region $7_3$.

Next, the controller 205 outputs a control signal for controlling the laser engine 230 including the converging optical system 204, to control the laser engine 230 including the converging optical system 204 such that the converging point P of the laser light L is located 50 µm from the front face 3 of the object 1 as shown in FIG. 18B. Then, the controller 205 controls the laser engine 230 including the converging optical system 204 such that the converging point P of the laser light L is relatively moved along the same one line 5a. At the same time, the controller 205 outputs a control signal for controlling the reflection type spatial light modulator 203, to control the reflection type spatial light modulator 203 such that aberration of the laser light L converged inside the object 1 becomes a predetermined aberration or less. Thereby, the modified region $7_4$ serving as a starting point for cutting along the same one line 5a is formed.

Note that the control signal for controlling the reflection type spatial light modulator 203 is stored in the controller 205 so as to be associated with the control signal for controlling the position of the laser engine 230 including the converging optical system 204 such that the converging point P of the laser light L is located 50 µm from the front face 3 of the object 1. Further, the direction in which the converging point P of the laser light L is relatively moved along the line 5a may be a direction opposite to that in the case of forming the modified region $7_3$ in order to improve the speed of forming the modified region $7_4$.

As described above, after the modified regions $7_1$ to $7_4$ in four lines are formed along the same one line 5a, the modified regions $7_1$ to $7_4$ in four lines are formed along another one of the lines 5a. Then, after the modified regions $7_1$ to $7_4$ in four lines are formed along each of all the lines 5a, the modified regions $7_1$ to $7_4$ in four lines are formed along each of all the lines 5b in the same way in the case in which the modified regions $7_1$ to $7_4$ are formed along the lines 5a.

In this way, in the case in which the plurality of lines 5 are set with respect to the object 1, provided that after the modified regions 7 in a plurality of lines are formed along one of the lines 5, the modified regions 7 in a plurality of lines are formed along another one of the lines 5, the following effect is brought about. That is, even in a case where there is undulation on the front face 3 of the object 1, in order to focus the converging point P of the laser light L on a position at a predetermined distance from the front face 3 with high precision, the AF unit 212 acquires data on varying levels of the front face 3 along the line 5, to fine-adjust a distance between the converging optical system 204 and the object 1 on the basis of the data on varying levels. Accordingly, provided that after the modified regions 7 in a plurality of lines are formed along one of the lines 5, the modified regions 7 in a plurality of lines are formed along another one of the lines 5, it is possible to decrease the number of switching data on varying levels, and it is possible to form the modified regions 7 in a plurality of lines along the respective lines 5 at positions at predetermined distances from the front face 3 of the object 1 with high precision.

As described above, in the laser working method according to the present embodiment, the object 1 is irradiated with the laser light L modulated by the reflection type spatial light modulator 203 such that aberration of the laser light L converged inside the object 1 becomes a predetermined aberration or less (or, the wavefront of the laser light L becomes a predetermined wavefront inside the object 1). Therefore, the aberration of the laser light L generated at a position on which the converging point P of the laser light L is located is made as small as possible, to enhance the energy density of the laser light L at that position, which makes it possible to form the modified region 7 with a high function as a starting point for cutting. In addition, because the reflection type spatial light modulator 203 is used, it is possible to improve the utilization efficiency of laser light L as compared with a transmissive type spatial light modulator. Such improvement of the utilization efficiency of the laser light L is particularly important in the case in which the modified region 7 serving as a starting point for cutting is formed in the plate-shaped object 1. Accordingly, in accordance with the laser working method according to the present embodiment, it is possible to reliably form the modified region 7 serving as a starting point for cutting. As a result, when a stress is applied to the object 1 in which the modified region 7 is formed, via an expand tape or the like, the modified region 7 sufficiently performs the function as a starting point for cutting. Therefore, it is possible to cut the object 1 along the line 5 with high precision, and to prevent generation of an uncut portion.

The present invention is not limited to the above-described embodiment.

For example, in the above-described embodiment, after the modified regions 7 in a plurality of lines are formed along one of the lines 5, the modified regions 7 in a plurality of lines are formed along another one of the lines 5. However, the modified region 7 in another one line may be formed along a plurality of lines 5 after the modified region 7 in one line is formed along the plurality of lines 5.

In that case, the following effect is brought about. That is, in a case where the object 1 breaks by the formation of the modified regions 7 in a plurality of lines along one of the lines 5, if the modified regions 7 in a plurality of lines are formed along another one of the lines 5 after the modified regions 7 in a plurality of lines are formed along one of the lines 5, the position of the object 1 is shifted by the break of the object 1. Then, in order to form the modified regions 7 along the lines 5 with high precision, it is necessary to correct the position of the object 1. However, if the modified region 7 in another one line is formed along a plurality of lines 5 after the modified region 7 in one line is formed along the plurality of lines 5, it is possible to prevent the position of the object 1 from being shifted by the break of the object 1, and the number of corrections for the position of the object 1 is decreased, which makes it possible to form the modified regions 7 in a plurality of lines along the plurality of lines 5 in a short time.

Further, at the time of forming modified regions 7 in one line or a plurality of lines including the modified region 7 farthest from the front face 3 that is the laser light entrance surface of the object 1 among the modified regions 7 in a plurality of lines, a distance between the converging optical system 204 and the object 1 may be changed such that a distance between converging optical system 204 that converges the laser light L inside the object 1 and the object 1 becomes a predetermined distance in accordance with the modified region 7 to be formed, and the laser light L may be modulated by the reflection type spatial light modulator 203 such that a wavefront of the laser light L becomes a predetermined wavefront inside the object 1 (or, aberration of the laser light L converged inside the object 1 becomes a predetermined aberration or less).

The reason for that modulation of the laser light L by the reflection type spatial light modulator 203 is required at the time of forming the modified region 7 farthest from the front face 3 that is the laser light entrance surface of the object 1 as described above, is because the farther from the laser light entrance surface the position at which the modified region 7 is formed is, the larger the aberration of the laser light L generated at the position on which the converging point P of the laser light L is located is. That is, for example, in the case of forming the modified region 7 closest to the front face 3 that is the laser light entrance surface of the object 1, when the aberration of the laser light L converged inside the object 1 becomes a predetermined aberration or less even if the laser light L is not modulated by the reflection type spatial light modulator 203, there is no need to modulate the laser light L by the reflection type spatial light modulator 203. Thereby, it is possible to reliably form the modified regions 7 serving as starting points for cutting even in the case in which the modified regions 7 in a plurality of lines along one of the lines 5 is formed. Note that, in the case in which modulation of the laser light L by the reflection type spatial light modulator 203 is not carried out, the reflection type spatial light modulator 203 is controlled to be utilized as a normal reflecting mirror (that is, pattern information is used so as to be not input or in an OFF state).

Further, in place of movement of the laser engine 230, a movement mechanism that moves the supporting base 201 in the thickness direction of the object 1 may be provided to the supporting base 201. Further, the converging optical system 204 may be moved in the thickness direction of the object 1 by utilizing the AF unit 212. Then, these may be combined.

Figure 29:
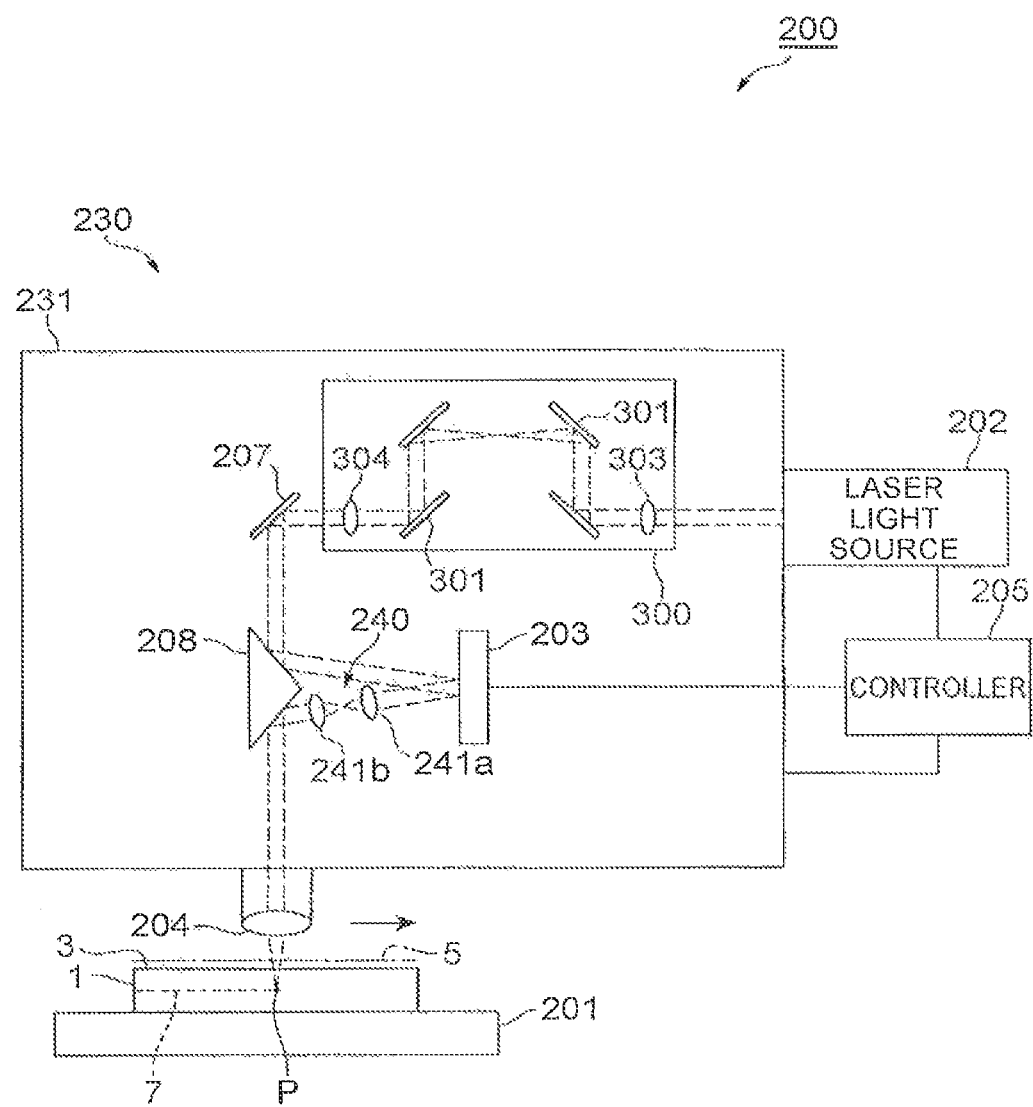
FIG. 29 is a schematic block diagram of yet another laser working apparatus according to the present embodiment.

Further, the reflection type spatial light modulator 203 and the adjustment optical system 240 as described above may be, as shown in FIG. 29, applied to the laser working apparatus 200 including an optical path length intergradation means 300 in place of the AF unit 212. The optical path length intergradation means 300 changes an optical path length between a lens 303 and a lens 304 by changing installing angles of a plurality of deflecting mirrors 301 on the basis of a height position of the front face 3 of the object 1 detected by a height position detecting means (not shown), to change a position of the converging point P of the laser light L converged by the converging optical system 204. This is because a distance to the position of the converging point P of the laser light L converged by the converging optical system 204 is expressed by a function of an optical path length from the lens 303 to the lens 304. Note that, as a height position detecting means, for example, a means for detecting a height position of the front face 3 on the basis of a change in height position of the reflected light when the laser light L is made incident onto the front face 3 of the object 1 at a predetermined incident angle, can be cited.

Figure 19:
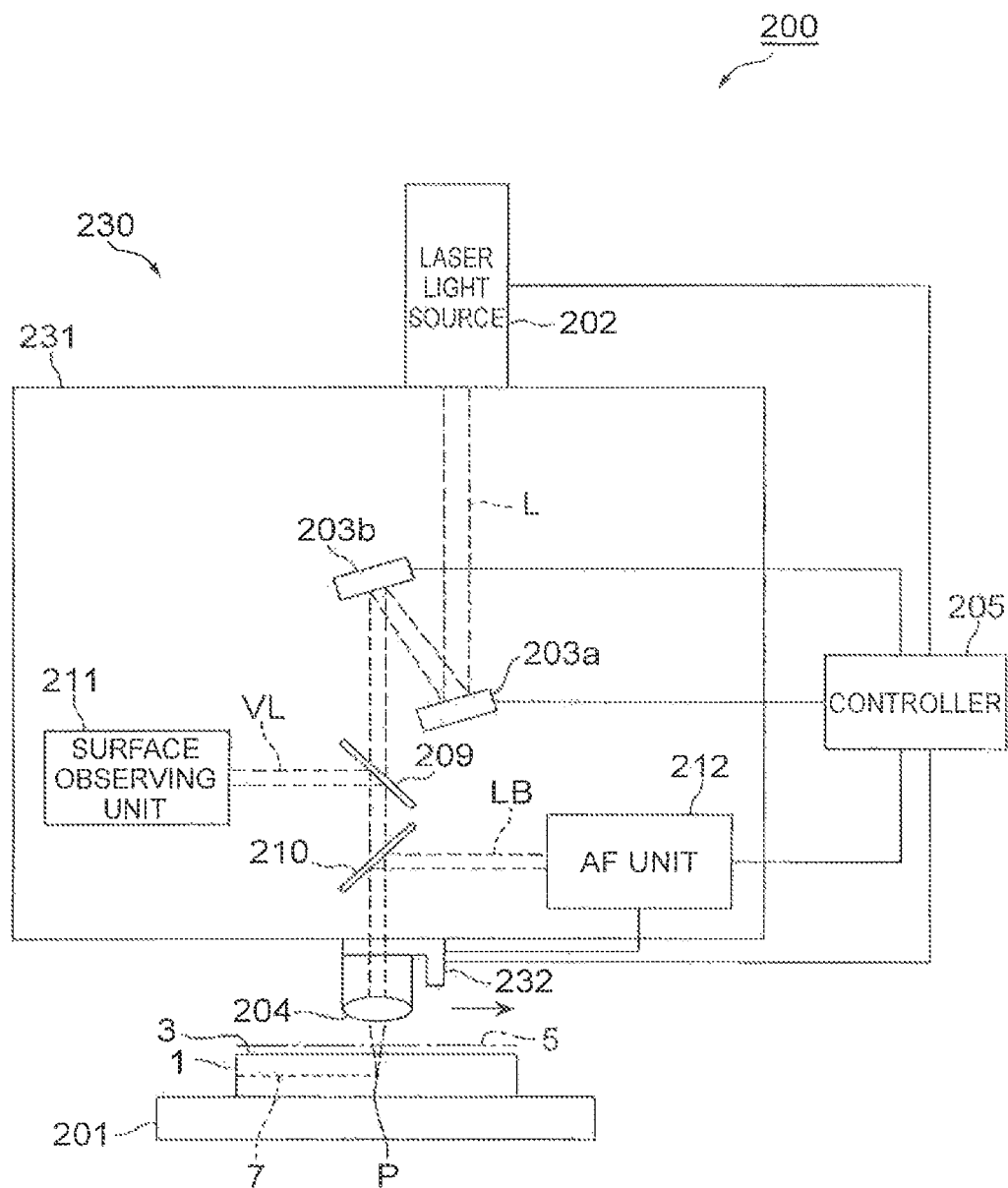
FIG. 19 is a schematic block diagram of another laser working apparatus according to the present embodiment.

Further, as shown in FIG. 19, the laser working apparatus 200 may be equipped with the supporting base 201, the laser light source 202, a plurality of (here, two) reflection type spatial light modulators 203*a* and 203*b* that modulate the laser light L emitted from the laser light source 202, the converging optical system 204, and the controller 205. The controller 205 has a function of controlling the reflection type spatial light modulators 203*a* and 203*b* such that an optical characteristic of the laser light L becomes a predetermined optical characteristic. Note that, as shown in FIG. 20, because the two reflection type spatial light modulators 203*a* and 203*b* are disposed so as to be equivalent to the disposition of lenses 403*a* and 403*b* of a double telecentric optical system, it is possible to control its beam diameter, its optical axis, or the like as an optical characteristic of the laser light L. Further, by at least one of the reflection type spatial light modulators 203*a* and 203*b*, it is also possible to modulate the laser light L such that a wavefront of the laser light L becomes a predetermined wavefront inside the object 1 (or, aberration of the laser light L converged inside the object 1 becomes a predetermined aberration or less).

In accordance with this laser working apparatus 200, because the laser working apparatus 200 is equipped with the plurality of reflection type spatial light modulators 203*a* and 203*b*, it is possible to control its beam diameter, its optical axis, or the like as an optical characteristic of the laser light L. Accordingly, even in the case in which the optical axis of the laser light L is shifted from any cause, it is possible to easily correct the shift, to reliably form the modified region 7 serving as a starting point for cutting.

Figure 28:
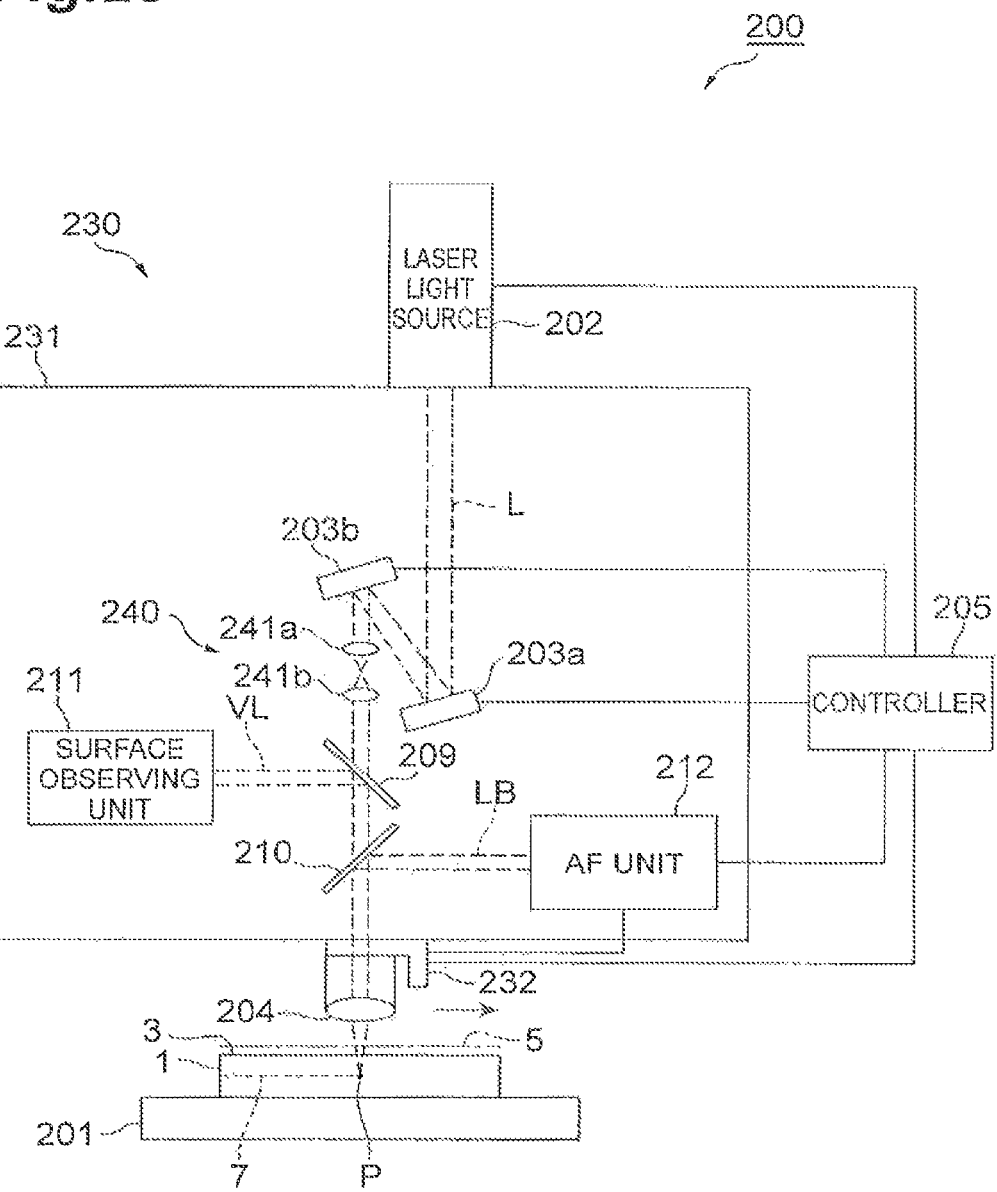
FIG. 28 is a schematic block diagram of another laser working apparatus according to the present embodiment.

At this time, as shown in FIG. 28, the adjustment optical system 240 may be provided. The position at which the adjustment optical system 240 is disposed differs depending on which of the reflection type spatial light modulators 203*a* and 203*b* is the wavefront controlled by. In the case in which the wavefront is controlled by the reflection type spatial light modulator 203*a*, the adjustment optical system 240 is disposed such that a distance between the reflection type spatial light modulator 203*a* and the lens 241*a* becomes the focal distance f1. On the other hand, in the case in which the wavefront is controlled by the reflection type spatial light modulator 203*b*, the adjustment optical system 240 is disposed such that a distance between the reflection type spatial light modulator 203*b* and the lens 241*a* becomes the focal distance f1. Then, in both cases, a distance between the lens 241*a* and the lens 241*b* is f1+f2, and a distance between the lens 241*b* and the converging optical system 204 is f2.

Further, at the time of forming the modified region 7, the laser light L may be modulated by the reflection type spatial light modulator 203 such that a numerical aperture of the laser light L converged inside the object 1 becomes a predetermined numerical aperture. In this case, for example, the modified region 7 with a high function as a starting point for cutting can be formed by changing the numerical aperture of the laser light L according to a material of the object 1, a distance to a position at which the modified region 7 must be formed, or the like.

Figure 22:
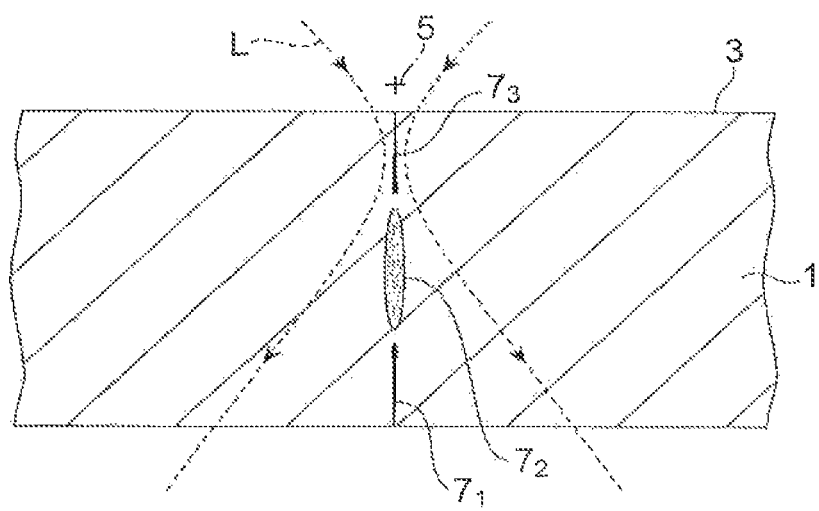
FIG. 22 is an explanatory diagram of the other laser working method according to the present embodiment.

Further, as shown in FIGS. 21 and 22, in the case in which the modified regions 7 serving as starting points for cutting are formed in at least three lines (here, three lines) along one of the lines 5 so as to line up in the thickness direction of the object 1, the modified regions $7_1$ to $7_3$ may be formed as follows.

First, as shown in FIG. 21A, the object 1 is irradiated with the laser light L modulated by the reflection type spatial light modulator 203 such that a numerical aperture of the laser light L converged inside the object 1 is made relatively larger, to form the modified region $7_1$ farthest from the front face 3 that is the laser light entrance surface of the object 1 along the line 5.

Next, as shown in FIG. 21B, the object 1 is irradiated with the laser light L modulated by the reflection type spatial light modulator 203 such that a numerical aperture of the laser light L converged inside the object 1 is made relatively smaller, to form the modified regions $7_2$ along the line 5.

Next, as shown in FIG. 22, the object 1 is irradiated with the laser light L modulated by the reflection type spatial light modulator 203 such that a numerical aperture of the laser light L converged inside the object 1 is made relatively larger, to form the modified region $7_3$ closest to the front face 3 that is the laser light entrance surface of the object 1 along the line 5.

As described above, at the time of forming the modified region $7_2$ except for the modified region $7_1$ farthest from the front face 3 that is the laser light entrance surface of the object 1 and the modified region $7_3$ closest to the front face 3 among the modified regions $7_1$ to $7_3$ in three lines, the laser light L is modulated by the reflection type spatial light modulator 203 such that a numerical aperture of the laser light L converged inside the object 1 is made smaller as compared with the case in which the modified regions $7_1$ and $7_3$ are formed. That is, at the time of forming the modified region $7_1$ farthest from the front face 3 that is the laser light entrance surface of the object 1 and the modified region $7_3$ closest to the front face 3 as the modified regions 7 particularly important as starting points for cutting, the object 1 is irradiated with the laser light L modulated by the reflection type spatial light modulator 203 such that a numerical aperture of the laser light L converged inside the object 1 is made larger as compared with the case in which the modified region $7_2$ therebetween is formed.

Thereby, the modified region $7_1$ farthest from the front face 3 that is the laser light entrance surface of the object 1 and the modified region $7_3$ closest to the front face 3 can be made to be the modified regions 7 with extremely high functions as starting points for cutting (for example, the modified regions 7 including break). Further, the modified region $7_2$ therebetween is made to be the modified region 7 which is relatively longer in the thickness direction of the object 1 (for example, the modified region 7 including a molten processed region), which makes it possible to decrease the number of scans of the laser light L along the line 5.

Note that, in the case in which the modified regions 7 are formed in a plurality of lines (for example, two lines) along the line 5 so as to line up in the thickness direction of the object 1, at the time of forming the modified regions 7 except for the modified region 7 closest to the front face 3 that is the laser light entrance surface of the object 1 or a rear face 21 that is the opposed surface opposed to the laser light entrance surface in the object 1 among the modified regions 7 in plurality of lines, the laser light L is preferably modulated by the reflection type spatial light modulator 203 such that a numerical aperture of the laser light L converged inside the object 1 is made smaller as compared with the case in which the modified region 7 closest to the front face 3 or the rear face 21 is formed.

In this laser working method, at the time of forming the modified region 7 closest to the front face 3 or the rear face 21 of the object as the modified region 7 particularly important as a starting point for cutting, the object 1 is irradiated with the laser light L modulated by the reflection type spatial light modulator 203 such that a numerical aperture of the laser light L converged inside the object 1 is made larger as compared with the case in which the other modified regions 7 are formed. Therefore, the modified region closest to the front face 3 or the rear face 21 of the object 1 can be made to be a modified region with an extremely high function as a starting point for cutting (for example, the modified region including break).

Further, the converging point P of the laser light L may be located on a position at a predetermined distance from the front face 3 that is the laser light entrance surface of the object 1 by, not moving the laser engine 230 including the converging optical system 204 and the supporting base 201, but modulating the laser light L by the reflection type spatial light modulator 203. In detail, in the case in which the laser light L is converged at a position relatively deeper from the front face 3 of the object 1, when the reflection type spatial light modulator 203 is controlled such that a spread angle of the laser light L emitted from the reflection type spatial light modulator 203 to be made incident onto the converging optical system 204 is made relatively smaller, to converge the laser light L at a position relatively shallower from the front face 3 of the object 1, it is recommended that the reflection type spatial light modulator 203 be controlled such that a spread angle of the laser light L emitted from the reflection type spatial light modulator 203 to be made incident onto the converging optical system 204 is made relatively larger.

Further, in the above-described embodiment, the wavefront data is acquired as Zernike polynomials. However, the embodiment is not limited thereto. For example, the wavefront data may be acquired as Seidel's classification of aberrations, associated Legendre polynomials, or the like.

Further, in the above-described embodiment, a control signal for controlling the reflection type spatial light modulator 203 such that aberration of the laser light L converged inside the object 1 becomes a predetermined aberration or less (or, the wavefront of the laser light L becomes a predetermined wavefront inside the object 1) is calculated on the basis of an actual measurement, and may be calculated on the basis of a simulation or the like. It is a matter of course that the control signal may be stored in the controller 205 in the case in which a control signal is calculated on the basis of a simulation or the like. However, the control signal may be not stored in the controller 205, and a control signal may be calculated immediately before the modified region 7 is formed.

Further, the object 1 is easily warped when its thickness reaches approximately 20 μm. Therefore, in order to form the modified region 7 at a position at a predetermined distance from the front face 3 that is the laser light entrance surface of the object 1, the front face 3 of the object 1 is preferably pressed down toward the supporting base 201 side with a laser light transmissive member such as a glass plate. However, in this case, aberration is generated under the effect of the laser light transmissive member, which results in deterioration in the converging power of the laser light L. Then, provided that the laser light L is modulated by the reflection type spatial light modulator 203 such that aberration of the laser light L converged inside the object 1 becomes a predetermined aberration or less taking into account the laser light transmissive member, it is possible to reliably form the modified region 7 serving as a starting point for cutting.

Further, a laser light entrance surface at the time of forming the modified region 7 is not limited to the front face 3 of the object 1, but may be the rear face 21 of the object 1.

Further, in the above-described embodiment, the modified region 7 including a molten processed region is formed inside the object 1 composed of a semiconductor material. However, another type of the modified region 7 such as a crack region or a refractive index changed region may be formed inside the object 1 composed of another material such as glass or a piezoelectric material.

INDUSTRIAL APPLICABILITY

In accordance with the present invention, it is possible to reliably form a modified region serving as a starting point for cutting.

The invention claimed is:

1. A manufacturing method of a laser working apparatus which includes a supporting base supporting a plate-shaped object to be processed, a laser light source emitting a laser,light, a reflection spatial light modulator modulating the laser light emitted from the laser light source, a converging optical system converging the laser light modulated by the reflection spatial light modulator, inside the object supported by the supporting base, and a controller controlling the reflection spatial light modulator, and that irradiates the object with the laser light while locating a converging point within the object, so as to form a modified region serving as a starting point for cutting along a line to cut the object, the manufacturing method of the laser working apparatus comprising the steps of:
preparing a laser working apparatus and acquiring standard wavefront data by measuring a wavefront of first laser light emitted from a converging optical system of the laser working apparatus;
acquiring wavefront data by measuring a wavefront of second laser light emitted from the converging optical system; and
calculating a control signal for controlling the reflection spatial light modulator such that the wavefront of the second laser light becomes the wavefront of the first laser light on the basis of the standard wavefront data and the wavefront data acquired by measuring a wavefront of the laser light, to store the control signal in the controller.

2. A laser working method including the steps of:
irradiating a plate-shaped object to be processed with a laser light; and
locating a converging point of the laser light within the object so as to form a modified region serving as a starting point for cutting along a line to cut the object, wherein
a reflection spatial light modulator, which modulates the laser light, a converging optical system, which converges the laser light modulated by the reflection spatial light modulator inside the object, and an adjustment optical system, which has a first optical element and a second optical element functioning as lenses and located on the optical path between the reflection spatial light modulator and the converging optical system are prepared,
disposing the first optical element and the second optical element so as to matching the wavefront form at the reflection spatial light modulator to the wavefront form at the converging optical system, and the first optical element and the second optical element become a double telecentric optical system,
at the time of forming the modified region, the laser light is modulated by a reflection spatial light modulator such that aberration of the laser light occurs at a position on which a converging point of the laser light is located inside the object becomes a predetermined aberration or less.

3. The laser working method according to claim 2, wherein
the first optical element and second optical element are disposed such that a distance between the reflection spatial light modulator and the first optical element becomes the first focal distance of the first optical element, a distance between the converging optical system and the second optical element becomes the second focal distance of the second optical element, and a distance between the first optical element the second optical element becomes the sum of the first focal distance and the second focal distance,
which forms modified regions in a plurality of lines so as to line up in the thickness direction of the object along the line to cut of the object, wherein at the time of forming the modified regions in one line or a plurality of lines including a modified region farthest from a laser light entrance surface of the object among the modified regions in a plurality of lines, modifies the distance between the convergence optical system and the object so that the distance between the convergence optical system that converges the laser light inside the object and the object becomes a predetermined distance, in accordance with the modified region to be formed.

4. The laser working method according to claim 3, wherein
in the case in which the plurality of lines are set with respect to the object, the modified regions are formed in a plurality of lines along another one of the lines after forming the modified regions in a plurality of lines along one of the lines.

5. The laser working method according to claim 3, wherein
in which the plurality of lines are set with respect to the object, the modified regions are formed in another one line along the plurality of lines after forming the modified regions in one line along the plurality of lines.

6. A laser working method comprising the steps of:
irradiating a plate-shaped object to be processed with a laser light; and
locating a converging point of the laser light within the object so as to form a modified region serving as a starting point for cutting along a line to cut the object, wherein
a reflection spatial light modulator, which modulates the laser light, converging optical system, which converges the laser light modulated by the reflection spatial light modulator inside the object, and an adjustment optical system, which has a first optical element and a second optical element functioning as lenses and located on the optical path between the reflection spatial light modulator and the converging optical system are prepared, disposing the first optical element and the second optical element so as to matching the wavefront form at the reflection spatial light modulator to the wavefront form at the converging optical system ,and the first optical element and the second optical element become a double telecentric optical system, at the time of forming the modified region, the laser light is modulated by a reflection spatial light modulator such that a wavefront of the laser light becomes a predetermined wavefront inside the object.

7. The laser working method according to claim 6, wherein the first optical element and second optical element are disposed such that a distance between the reflection spatial light modulator and the first optical element becomes the first focal distance of the first optical element, a distance between the converging optical system and the second optical element becomes the second focal distance of the second optical element, and a distance between the first optical element the second optical element becomes the sum of the first focal distance and the second focal distance, which forms modified regions in a plurality of lines so as to line up in the thickness direction of the object along the line to cut of the object, wherein at the time of forming the modified regions in one line or a plurality of lines including a modified region farthest from a laser light entrance surface of the object among the modified regions in a plurality of lines, modifies the distance between the convergence optical system and the object so that the distance between the convergence optical system that converges the laser light inside the object and the object becomes a predetermined distance, in accordance with the modified region to be formed.

8. The laser working method according to claim 7, wherein in the case in which the plurality of lines are set with respect to the object, the modified regions are formed in a plurality of lines along another one of the lines after forming the modified regions in a plurality of lines along one of the lines.

9. The laser working method according to claim 7, wherein in the case in which the plurality of lines are set with respect to the object, the modified regions are formed in another one line along the plurality of lines after forming the modified region in one line along the plurality of lines.

10. A laser working apparatus that irradiates a plate-shaped object to be processed with a laser light while locating a converging point within the object, so as to form a modified region serving as a starting point for cutting along a line to cut the object, the laser working apparatus comprising:

a supporting base supporting the object;

a laser light source emitting the laser light;

a reflection spatial light modulator modulating the laser light emitted from the laser light source;

a converging optical system converging the laser light modulated by the reflection spatial light modulator, inside the object supported by the supporting base;

an adjustment optical system that has a first optical element and a second optical element functioning as lenses and located on the optical path between the reflection spatial light modulator and the converging optical system, and a controller that, at the time of forming the modified region, controls at least one of the supporting base and the converging optical system such that a converging point of the laser light is located at a predetermined distance from a laser light entrance surface of the object and the converging point of the laser light is relatively moved along the line, and the laser light is modulated by a reflection spatial light modulator such that aberration of the laser light occurs at a position on which a converging point of the laser light is located inside the object becomes a predetermined aberration or less, wherein the first optical element and the second optical element are disposed so as to match the wavefront form at the reflection spatial light modulator to the wavefront form at the converging optical system, and the first optical element and the second optical element become a double telecentric optical system.

11. The laser working apparatus according to claim 10, wherein the controller stores a control signal for controlling at least one of the supporting base and the converging optical system such that a converging point of the laser light is located at a predetermined distance from the laser light entrance surface for each of the modified regions formed in a plurality of lines along the line so as to line up in the thickness direction of the object, and a control signal for controlling the reflection spatial light modulator such that aberration of the laser light converged inside the object becomes a predetermined aberration or less so as to associate the control signals with each other therein.

12. The laser working apparatus according to claim 11, wherein the adjustment optical system is disposed between the reflection spatial light modulator and a reflective member that reflects the laser light emitted from the reflection spatial light modulator.

13. The laser working apparatus according to claim 10, wherein the adjustment optical system is disposed between the reflection spatial light modulator and a reflective member that reflects the laser light emitted from the reflection spatial light modulator.

14. A laser working apparatus that irradiates a plate-shaped object to be processed with a laser light while locating a converging point within the object, so as to form a modified region serving as a starting point for cutting along a line to cut the object, the laser working apparatus comprising:

a supporting base supporting the object;

a laser light source emitting the laser light;

a reflection spatial light modulator modulating the laser light emitted from the laser light source;

a converging optical system converging the laser light modulated by the reflection spatial light modulator, inside the object supported by the supporting base;

an adjustment optical system that has a first optical element and a second optical element functioning as lenses and located on the optical path between the reflection spatial light modulator and the converging optical system, and a controller that, at the time of forming the modified region, controls at least one of the supporting base and the converging optical system such that a converging point of the laser light is located at a predetermined distance from a laser light entrance surface of the object and the converging point of the laser light is relatively moved along the line, and controls the reflection spatial light modulator such that a wavefront of the laser light becomes a predetermined wavefront inside the object, wherein the first optical element and the second optical element are disposed so as to match the wavefront form at the reflection spatial light modulator to the wavefront form at the converging optical system, and the first optical element and the second optical element become a double telecentric optical system.

15. The laser working apparatus according to claim 14, wherein the adjustment optical system is disposed between the reflection spatial light modulator and a reflective member that reflects the laser light emitted from the reflection spatial light modulator.

16. The laser working apparatus according to claim 14, wherein the controller stores a control signal for controlling at least one of the supporting base and the converging optical system such that a converging point of the laser light is located at a predetermined distance from the laser light entrance surface for each of the modified regions formed in a plurality of lines along the line so as to line up in the thickness direction of the object, and a control signal for controlling the reflection spatial light modulator such that a wavefront of the laser light becomes a predetermined wavefront inside the object so as to associate the control signals with each other therein.

17. The laser working apparatus according to claim 16, wherein the adjustment optical system is disposed between the reflection spatial light modulator and a reflective member that reflects the laser light emitted from the reflection spatial light modulator.

\* \* \* \* \*